US010516093B2

(12) United States Patent
Ueda et al.

(10) Patent No.: US 10,516,093 B2
(45) Date of Patent: Dec. 24, 2019

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Miki Ueda, Tokyo (JP); Takayuki Watanabe, Yokohama (JP); Shunsuke Murakami, Sheffield (GB)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/923,843

(22) Filed: Mar. 16, 2018

(65) Prior Publication Data
US 2018/0204999 A1 Jul. 19, 2018

Related U.S. Application Data

(63) Continuation of application No. 15/280,678, filed on Sep. 29, 2016, now Pat. No. 9,960,343, which is a (Continued)

(30) Foreign Application Priority Data
Aug. 27, 2012 (JP) ................................ 2012-186594

(51) Int. Cl.
*H01L 41/187* (2006.01)
*C04B 35/495* (2006.01)
(Continued)

(52) U.S. Cl.
CPC ............ *H01L 41/1871* (2013.01); *B06B 1/06* (2013.01); *B41J 2/14201* (2013.01);
(Continued)

(58) Field of Classification Search
CPC ............. H01L 41/1871; H01L 41/0477; H01L 41/083; H01L 41/1873; H01L 41/273;
(Continued)

(56) References Cited

U.S. PATENT DOCUMENTS

2011/0204754 A1* 8/2011 Kawada ................ C04B 35/495
310/363

FOREIGN PATENT DOCUMENTS

JP 2009242166 A 10/2009
JP 2012195577 A 10/2012

OTHER PUBLICATIONS

IP.com search.*
IP.com search (Year: 2019).*

* cited by examiner

*Primary Examiner* — Lisa Solomon
(74) *Attorney, Agent, or Firm* — Canon U.S.A., Inc. IP Division

(57) ABSTRACT

The present invention provides a piezoelectric material not containing lead and potassium, showing satisfactory insulation and piezoelectricity, and having a high Curie temperature. The invention relates to a piezoelectric material includes a main component containing a perovskite-type metal oxide represented by Formula (1): $(Na_xBa_{1-y})(Nb_y Ti_{1-y})O_3$ (wherein, $0.80 \leq x \leq 0.94$ and $0.83 \leq y \leq 0.94$), and an additive component containing at least one element selected from Mn and Ni, wherein the content of the Ni is 0 mol or more and 0.05 mol or less based on 1 mol of the perovskite-type metal oxide, and the content of the Mn is 0 mol or more and 0.005 mol or less based on 1 mol of the perovskite-type metal oxide.

40 Claims, 14 Drawing Sheets

Related U.S. Application Data continuation of application No. 14/423,687, filed as application No. PCT/JP2013/072929 on Aug. 21, 2013, now Pat. No. 9,496,484.

(51) Int. Cl.

| | |
|---|---|
| *C04B 35/626* | (2006.01) |
| *C04B 35/645* | (2006.01) |
| *H01L 41/43* | (2013.01) |
| *H01L 41/083* | (2006.01) |
| *H01L 41/09* | (2006.01) |
| *H01L 41/273* | (2013.01) |
| *H02N 2/10* | (2006.01) |
| *H02N 2/16* | (2006.01) |
| *B41J 2/14* | (2006.01) |
| *H01L 41/047* | (2006.01) |
| *H01L 41/277* | (2013.01) |
| *H01L 41/297* | (2013.01) |
| *H01L 41/333* | (2013.01) |
| *B06B 1/06* | (2006.01) |
| *G02B 7/08* | (2006.01) |
| *G02B 7/10* | (2006.01) |
| *H02N 2/00* | (2006.01) |
| *G02B 27/00* | (2006.01) |

(52) U.S. Cl.
CPC ......... *B41J 2/14233* (2013.01); *C04B 35/495* (2013.01); *C04B 35/62685* (2013.01); *C04B 35/6455* (2013.01); *G02B 7/08* (2013.01); *G02B 7/102* (2013.01); *H01L 41/0471* (2013.01); *H01L 41/0477* (2013.01); *H01L 41/083* (2013.01); *H01L 41/09* (2013.01); *H01L 41/0973* (2013.01); *H01L 41/1873* (2013.01); *H01L 41/273* (2013.01); *H01L 41/277* (2013.01); *H01L 41/297* (2013.01); *H01L 41/333* (2013.01); *H01L 41/43* (2013.01); *H02N 2/001* (2013.01); *H02N 2/106* (2013.01); *H02N 2/163* (2013.01); *B41J 2202/03* (2013.01); *C04B 2235/3201* (2013.01); *C04B 2235/3215* (2013.01); *C04B 2235/3232* (2013.01); *C04B 2235/3236* (2013.01); *C04B 2235/3251* (2013.01); *C04B 2235/3255* (2013.01); *C04B 2235/3262* (2013.01); *C04B 2235/3267* (2013.01); *C04B 2235/3279* (2013.01); *C04B 2235/3281* (2013.01); *C04B 2235/449* (2013.01); *C04B 2235/652* (2013.01); *C04B 2235/6567* (2013.01); *C04B 2235/6581* (2013.01); *C04B 2235/6584* (2013.01); *C04B 2235/667* (2013.01); *C04B 2235/768* (2013.01); *C04B 2235/77* (2013.01); *C04B 2235/785* (2013.01); *C04B 2235/786* (2013.01); *C04B 2235/81* (2013.01); *C04B 2235/85* (2013.01); *C04B 2235/96* (2013.01); *G02B 27/0006* (2013.01); *H02N 2/10* (2013.01)

(58) Field of Classification Search
CPC ..... B06B 1/06; B41J 2/14201; B41J 2/14233; B41J 2202/03; G02B 7/08; G02B 7/102; G02B 27/0006; H02N 2/001; H02N 2/10
See application file for complete search history.

PIEZOELECTRIC MATERIAL, PIEZOELECTRIC ELEMENT, AND ELECTRONIC APPARATUS

CROSS REFERENCE TO RELATED APPLICATION

The present application is a continuation of U.S. patent application Ser. No. 15/280,678, filed on Sep. 29, 2016, which is a continuation of U.S. patent application Ser. No. 14/423,687, filed on Feb. 24, 2015, now U.S. Pat. No. 9,496,484, which is a National Phase Application of International Application No. PCT/JP2013/072929, filed Aug. 21, 2013, which claims the benefit of Japanese Patent Application No. 2012-186594, filed Aug. 27, 2012, which are hereby incorporated by reference herein in their entireties.

TECHNICAL FIELD

The present invention relates to a piezoelectric material, in particular, a lead-free piezoelectric material. The present invention also relates to a piezoelectric element and an electronic apparatus including the piezoelectric material.

BACKGROUND ART

Lead zirconate titanate, which is a typical piezoelectric material containing lead, is used in a variety of piezoelectric devices such as actuators, oscillators, sensors, and filters. However, it has been pointed out that lead components in discarded piezoelectric devices will be dissolved into the soil if the piezoelectric devices are exposed to acid rain and will cause ecological damages. Accordingly, researches and developments of lead-free piezoelectric materials have been actively conducted for providing lead-free piezoelectric devices.

Typical lead-free piezoelectric materials that are currently widely being studied are piezoelectric materials including potassium niobate. However, since the raw material (e.g., potassium carbonate) powder used in synthesis of piezoelectric materials containing potassium has high moisture absorbing properties, it is difficult to exactly weigh a raw material powder at an intended molar ratio. In addition, piezoelectric materials containing potassium niobate ($KNbO_3$) have deliquescency, and the piezoelectricity of some piezoelectric ceramics containing potassium niobate deteriorates with time. Furthermore, in some piezoelectric materials containing potassium niobate, the successive phase transition temperature between tetragonal and orthorhombic crystals is within the operating temperature range (e.g., from 0° C. to 80° C.) of the piezoelectric device. The piezoelectricity significantly varies in a temperature range around the successive phase transition temperature, which causes a problem that the performance of piezoelectric device significantly varies depending on the operating temperature.

NPL 1 also reports on a piezoelectric material not containing lead and potassium, i.e., a solid solution of sodium niobate ($NaNbO_3$) and barium titanate ($BaTiO_3$) (hereinafter, referred to as NN-BT), which is an antiferroelectric material. It is disclosed that the piezoelectric ceramic containing sodium niobate and barium titanate at a ratio of 9:1 had a piezoelectric constant $d_{33}$ of 147 pC/N.

PTL 1 discloses a niobate-based piezoelectric ceramic having a high electromechanical coupling factor and high heat resistance by adding cobalt oxide (CoO) to NN-BT. However, the insulation is low, i.e., $10^6 \Omega$ or less, and, therefore, polarization of some samples are difficult.

PTL 2 provides a method of producing a niobate-based piezoelectric ceramic having a high Curie temperature and satisfactory piezoelectric properties. It is disclosed that the piezoelectric ceramic of a solid solution of NN-BT and strontium titanate ($SrTiO_3$) had a piezoelectric constant $d_{33}$ of 14 to 126 pm/V.

CITATION LIST

Patent literature

PTL 1 Japanese Patent Laid-Open No. 2009-227535
PTL 2 Japanese Patent Laid-Open No. 2008-156172

Non Patent literature

NPL 1 J. T. Zeng et al., Journal of the American Ceramic Society, 2006, vol. 89, pp. 2828-2832

SUMMARY OF INVENTION

Technical Problem

In the known technologies, unfortunately, the piezoelectric performance of NN-BT is insufficient.

The present invention provides a piezoelectric material that does not contain lead and potassium, has higher Youngs's modulus $Y_{11}$ and piezoelectric constant $d_{33}$ than those of NN-BT, and shows satisfactory insulation. The present invention also provides a piezoelectric ceramic of the piezoelectric material, a piezoelectric element and a multilayered piezoelectric element including the piezoelectric material, a method of producing the multilayered piezoelectric element, a liquid discharge head, a liquid discharge device, an ultrasonic motor, an optical apparatus, a vibratory device, a dust removing device, an image pickup device, and an electronic apparatus.

Solution to Problem

The piezoelectric material according to the present invention is composed of a main component containing a perovskite-type metal oxide represented by Formula (1) and an additive component containing at least one element selected from Mn and Ni. The content of the Mn is 0 mol or more and 0.005 mol or less based on 1 mol of the perovskite-type metal oxide, and the content of the Ni is 0 mol or more and 0.05 mol or less based on 1 mol of the perovskite-type metal oxide.

$$(Na_xBa_{1-y})(Nb_yTi_{1-y})O_3 \text{ (wherein, } 0.80 \leq x \leq 0.94, \text{ and } 0.83 \leq y \leq 0.94). \quad \text{Formula (1):}$$

The present invention further provides a piezoelectric ceramic of a piezoelectric material, wherein the piezoelectric material is mainly composed of the piezoelectric material mentioned above, and Mn is present inside crystal grains constituting the piezoelectric ceramic.

The present invention further provides a piezoelectric ceramic of a piezoelectric material, wherein the piezoelectric material is mainly composed of the piezoelectric material mentioned above, and Ni is present at grain boundaries of the crystal grains constituting the piezoelectric ceramic.

Advantageous Effects of Invention

The present invention can provide a piezoelectric material not containing lead and potassium, showing satisfactory insulation and piezoelectricity, and having a high Curie temperature. Since the piezoelectric material of the present invention does not contain lead, the load on the environment is low. In addition, since the piezoelectric material does not contain potassium, the sinterability and the humidity resistance are excellent.

DESCRIPTION OF EMBODIMENTS

Figure 1:
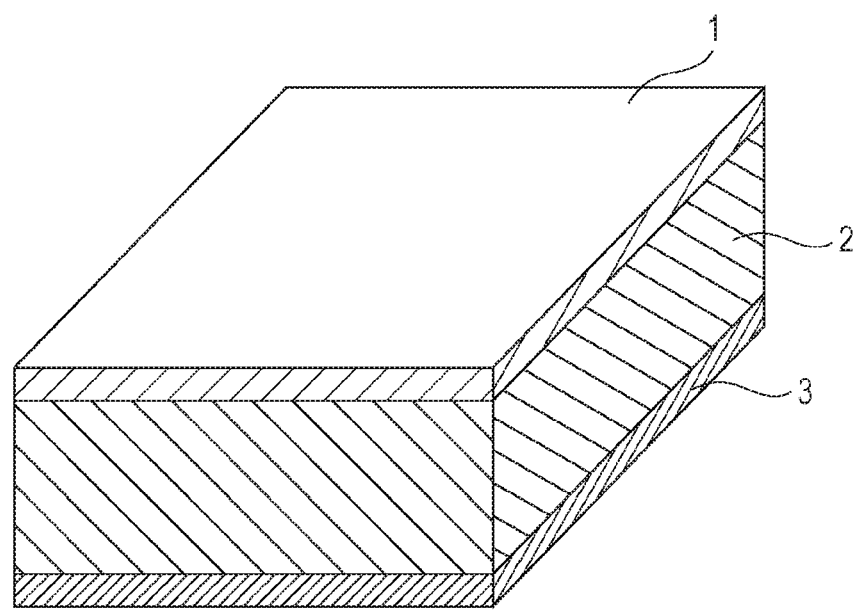
FIG. 1 is a schematic diagram illustrating an embodiment of the configuration of a piezoelectric element of the present invention.

Embodiments of the present invention will now be described.

The present invention provides a lead-free piezoelectric material having a basic configuration of NN-BT and showing satisfactory piezoelectricity and insulation. The piezoelectric material of the present invention can be used in a variety of purposes, such as capacitors, memories, and sensors, using the characteristics as a dielectric.

The piezoelectric material of the present invention is composed of a main component containing a perovskite-type metal oxide represented by Formula (1) and an additive component containing at least one element selected from Mn and Ni. The content of the Mn is 0 mol or more and 0.005 mol or less based on 1 mol of the perovskite-type metal oxide, and the content of the Ni is 0 mol or more and 0.05 mol or less based on 1 mol of the perovskite-type metal oxide.

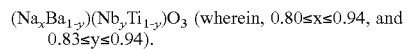 (wherein, 0.80≤x≤0.94, and 0.83≤y≤0.94). Formula (1):

The perovskite-type metal oxide of the present invention refers to a metal oxide having a perovskite-type structure (also referred to as perovskite structure), which is ideally a tetragonal structure, as described in Iwanami Dictionary of Physics and Chemistry, 5th Edition (Iwanami Shoten, Published on Feb. 20, 1998). The metal oxide having a perovskite-type structure is generally expressed by a chemical formula: $ABO_3$. In the perovskite-type metal oxide, elements A and B occupy specific unit cell positions called A-site and B-site, respectively, in the ion forms. For example, in a cubic unit cell, the element A is placed at the vertexes of the cubic, and the element B is placed at the body-centered position of the cubic. The element O occupies the face-centered positions as anions of oxygen.

The perovskite-type metal oxide represented by Formula (1) contains at least one element selected from Mn and Ni and may further contain Cu. In such a case, the piezoelectric material of the present invention can also be represented by Formula (2):

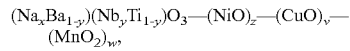 Formula (2):

wherein, the value of each parameter is as follows: 0.80≤x≤0.94, 0.83≤y≤0.94, 0≤z≤0.05, 0≤v≤0.01, 0≤w≤0.005, and 0<z+w.

The metal oxide represented by Formula (2), the metal elements positioned at the A-site are Na and Ba, and the metal elements positioned at the B-site are Nb and Ti. However, the Na, Ba, Ni, Cu, and Mn atoms may be partially positioned at the B-site. Similarly, the Ti, Nb, Ni, Cu, and Mn atoms may be partially positioned at the A-site. In addition, in order to readily produce the piezoelectric material of the present invention or to adjust the physical properties of the piezoelectric material of the present invention, the Ba may be partially replaced with a divalent metal element, such as Sr or Ca. Similarly, the Nb may be partially replaced with a pentavalent metal element, such as Ta or V, in a range of 20 mol % or less. Similarly, the Ti may be partially replaced with Zr or Sn in a range of 20 mol % or less; and the Na may be partially replaced with Li in a range of 15 mol % or less.

Furthermore, the characteristics of the piezoelectric material of the present invention are not deteriorated even if other elements are also substituted, as long as the substitution amounts are each 0.1 mol % or less based on the content of Ba or Nb contained in piezoelectric material represented by Formula (2).

The molar ratio of the elements at the B-site to the element O in Formula (2) is basically 1:3, but the molar ratio may shift slightly (e.g., in a range of 1.00:2.94 to 1.00:3.06) as long as the perovskite-type structure is the primary phase of the metal oxide. Such a case is included in the scope of the present invention. The perovskite-type structure of the metal oxide can be confirmed by structural analysis, such as X-ray diffraction or electron beam diffraction.

The piezoelectric material according to the present invention may be in any form, such as a ceramic, powder, single crystal, film, or slurry, and, in particular, can be in a ceramic form. Throughout the specification, the term "ceramic" refers to aggregate (also referred to as bulk body) of crystal grains of a metal oxide as the base component and fired by heat treatment, a so-called polycrystal. The ceramic includes those processed after sintering.

In Formula (2), if the value of x is smaller than 0.80, the amount of Na relative to Nb is low to cause occurrence of an impurity phase (a phase having an X-ray diffraction pattern similar to that of $Ba_4Nb_2O_9$, $Ba_6Ti_7Nb_9O_{42}$, $Ba_3Nb_4Ti_4O_{21}$, $Ba_3Nb_{3.2}Ti_5O_{21}$, or the like). A metal oxide sample containing a large amount of impurity phase has a low resistivity of $10^7$ to $10^8$ Ω·cm and makes the polarization treatment difficult.

A value of x larger than 0.94 decreases the piezoelectricity. In a range of x of 0.80≤x≤0.94, occurrence of impurity phase can be inhibited, and a satisfactory piezoelectricity is achieved.

In Formula (2), when the value of y, which indicates the amount of Nb at the B-site, is smaller than 0.83, the Curie temperature is low and may decrease to be lower than 110° C. A value of y larger than 0.94 decreases the piezoelectricity. In a range of y of 0.83≤y≤0.94, a high Curie temperature and satisfactory piezoelectricity are achieved.

When the value of y is in a range of 0.83≤y≤0.94, the Curie temperature is roughly in a range of 110° C. to 310° C., and the polarization treatment can be readily performed. Furthermore, when the value of y is in a range of 0.88≤y≤0.90, the Curie temperature is roughly in a range of 190° C. to 230° C., and a reduction in piezoelectric performance due to heat in the device-producing process is prevented.

The term "Curie temperature" indicates the temperature at which the piezoelectricity of a piezoelectric material is lost. Throughout the specification, the temperature showing a maximum dielectric constant near the phase transition temperature between the ferroelectric phase and the paraelectric phase is the Curie temperature. The perovskite-type metal oxide of the present invention has a successive phase transition temperature, which is the temperature causing successive phase transition from a tetragonal ferroelectric phase to an orthorhombic ferroelectric phase, in a temperature range lower than the Curie temperature. Since the relative dielectric constant becomes the maximum or shows a point of reverse curve at the successive phase transition temperature, the successive phase transition temperature can be determined by evaluating the temperature dependability of the relative dielectric constant, as in Curie temperature. For example, a solid solution represented by 0.9 $(NaNbO_3)$– 0.1 $(BaTiO_3)$ causes phase transition from orthorhombic crystals to tetragonal crystals and then to cubic crystals with an increase in temperature.

The maximum piezoelectric performance is obtained at near the successive phase transition temperature. Accordingly, if it is required that the constant piezoelectric performance be not affected by temperature in the operating temperature range (e.g., –30° C. to 60° C.) of a device, the successive phase transition should be out of the operating temperature range. If it is important that the piezoelectric performance is high at a certain temperature than that the piezoelectric performance does not depend on temperature, the successive phase transition can be within the operating temperature range of the device. A material that can adjust the successive phase transition temperature in accordance with the specification of a device has high versatility.

The piezoelectric material of the present invention is characterized in that in addition to the perovskite-type metal oxide represented by Formula (1), at least one element selected from Mn and Ni is contained in the material.

In Formula (2), the value of w, which indicates the content of Mn, is in a range of 0≤w≤0.005; the value of z, which indicates the content of Ni, is in a range of 0≤z≤0.05; and w and z satisfy a requirement of 0<w+z. In Formula (2), the addition forms of Mn and Ni are respectively $MnO_2$ and NiO, for convenience, but the Mn and Ni in the piezoelectric material of the present invention may be in any state. The piezoelectric material of the present invention containing 0.5 mol % or less of Mn (w≤0.005) can have high resistivity, piezoelectric constant, electromechanical coupling factor, electromechanical quality factor, Youngs's modulus, and density. The piezoelectric material of the present invention containing 5 mol % or less of Ni can have high resistivity, piezoelectric constant, electromechanical coupling factor, electromechanical quality factor, Youngs's modulus, and density. In addition, the piezoelectric material of the present invention containing 5 mol % or less of Ni (z≤0.05) can have a low sintering temperature. The sintering temperature is the lowest firing temperature necessary for obtaining a sintered compact having a relative density of 95% or more. When the spontaneous polarization of the piezoelectric material of the present invention is pinned, Mn and Ni can reduce the pinning of the spontaneous polarization. A reduction in pinning causes an increase in remnant polarization value or a decrease in coercive field in the polarization-electric field hysteresis curve. Furthermore, the direction of the spontaneous polarization can be readily aligned by polarization treatment, the phase of the impedance in resonance varies more largely, or the electromechanical coupling factor is increased.

The at least one element selected from Mn and Ni may be present at the A-site (12-fold coordination) of the perovskite structure, at the B-site (6-fold coordination), or at the both and may be present at grain boundaries of a ceramic.

In sintering of crystals containing sodium niobate as a component, Na may evaporate or diffuse to cause a shortage of Na relative to Nb in the sample composition after sintering. That is, a deficiency occurs in the A-site. However, a raw material powder containing an excess amount of a Na raw material may cause a reduction in insulation of the sintered compact. The deficiency can be compensated by adding Ni to the piezoelectric material such that a part of Ni occupies the A-site. Alternatively, raw materials may be weighed to intentionally cause a shortage of Na relative to Nb within a range not exceeding 5%.

The piezoelectric material of the present invention can contain 0.01 mol or less (excluding 0 mol) of Cu based on 1 mol of perovskite-type metal oxide represented by Formula (1). Herein, in Formula (2), the addition form of Cu is CuO for convenience, but the Cu in the piezoelectric material of the present invention may be in any state.

The piezoelectric material of the present invention containing 1 mol % or less of Cu can have high resistivity, electromechanical coupling factor, electromechanical quality factor, Youngs's modulus, and density and can have a low firing temperature. The sintering temperature is the lowest firing temperature necessary for obtaining a sintered compact having a relative density of 95% or more. When the spontaneous polarization of the piezoelectric material of the present invention is pinned, Cu can reduce the pinning of the spontaneous polarization. A reduction in pinning causes an increase in remnant polarization value or a decrease in coercive field in the polarization-electric field hysteresis curve. Furthermore, the direction of the spontaneous polarization can be readily aligned by polarization treatment, the phase of the impedance in resonance varies more largely, or the electromechanical coupling factor is increased.

Cu may be present at the A-site (12-fold coordination) of the perovskite structure, at the B-site (6-fold coordination), or at the both and may be present at grain boundaries of a ceramic.

In sintering of crystals containing sodium niobate as a component, Na may evaporate or diffuse to cause a shortage of Na relative to Nb in the sample composition after sintering. That is, a deficiency occurs in the A-site. However, a raw material powder containing an excess amount of a Na raw material may cause a reduction in insulation of the sintered compact. The deficiency can be compensated by adding Cu to the piezoelectric material such that a part of Cu occupies the A-site. Alternatively, raw materials may be weighed to intentionally cause a shortage of Na relative to Nb within a range not exceeding 5%.

A reduction in crystal deficiency by occupation of the A-site by at least one element selected from Mn and Ni can provide at least one of the following effects:
(1) an increase in resistivity,
(2) an increase in the phase angle of the impedance in resonance,
(3) an increase in remnant polarization value evaluated by polarization-electric field hysteresis measurement or a reduction in coercive field,
(4) an increase in electromechanical coupling factor,
(5) a reduction in electromechanical quality factor,
(6) a reduction in Youngs's modulus, and
(7) a reduction in dielectric loss tangent (tan δ).

Occupation of the B-site by the at least one element selected from Mn and Ni forms oxygen defects and defect dipoles to form an internal electric field. Accordingly, a part of the at least one element selected from Mn and Ni added to the piezoelectric material may occupy the B-site.

Occupation of the B-site by at least one element selected from Mn and Ni can provide at least one of the following effects:
(1) a reduction in electromechanical coupling factor or piezoelectric constant,
(2) an increase in electromechanical quality factor,
(3) an increase in Youngs's modulus,
(4) formation of internal electric field, and
(5) an increase in resistivity.

The magnitude of the internal electric field is a half of the difference in magnitude between the positive and negative coercive fields obtained from the polarization-electric field hysteresis curve. Since the defect polarization is also aligned in an electric field application direction by polarization treatment, a polarization-treated sample can be used in estimation of the internal electric field magnitude.

All of the Mn and Ni components are not necessarily present at the A-site or B-site, and a part of the Mn and Ni components may be present at grain boundaries. The Mn and the Ni can be present at grain boundaries in the oxide form. The disproportionate presence of a part of the Mn and Ni components at grain boundaries inhibits pores. As a result, effects, such as an increase in electromechanical quality factor and an increase in Youngs's modulus, are obtained. In addition, the presence of Mn and Ni at grain boundaries reduces the grain-boundary friction to harden the material.

The distribution of Mn and Ni in a sample and the occupation sites in crystals can be evaluated by electron microscopic observation, energy-dispersive X-ray spectroscopy, X-ray diffraction, Raman scattering, or transmission electron microscopic observation.

When a part of Mn and Ni is present at both the A-site and the B-site, the above-mentioned effects are additively provided. Since the effects additively provided can be controlled by the amounts of Mn and Ni, Mn and Ni may be present at both the A-site and the B-site.

When Ni is present only at the A-site, since a Ni ion is smaller than a Na ion and a Ba ion, the unit cell volume decreases.

The volume of a unit cell can be evaluated by X-ray diffraction.

An amount of Ni higher than 0.05 mol based on 1 mol of the perovskite-type metal oxide ($z>0.05$) may cause occurrence of an impurity phase to reduce the piezoelectricity.

The piezoelectric material of the present invention can satisfy a requirement of $x<y$ in Formula (1). When x is smaller than y, Ni is taken in the crystal lattice to readily exhibit the effects of the present invention. The composition of starting materials may be adjusted such that x is smaller than y. If x is not smaller than y, the insulation of a sample decreases.

In order to obtain a piezoelectric ceramic from the piezoelectric material of the present invention, a green compact before firing is formed. The green compact is a solid of a molded raw material powder. The raw material powder should have high purity. Since contamination with Mg considerably affects the piezoelectric performance of a sample, a raw material containing less Mg should be used. Examples of the molding include uniaxial pressing, cold hydrostatic pressing, hot hydrostatic pressing, casting, and extrusion. The green compact can be produced from a granulated powder. Sintering of the green compact formed from a granulated powder has an advantage that the size distribution of the crystal grains of the sintered compact can be readily uniformized.

The raw material powder of the piezoelectric material may be granulated by any method. Spray drying is advantageous from the viewpoint of providing a granulated powder with a more uniform grain diameter.

Examples of the binder that can be used in granulation include polyvinyl alcohol (PVA), polyvinyl butylal (PVB), and acrylic resins. The binder is used in an amount of 1 to 10 parts by weight based on the amount of the raw material powder of the piezoelectric material, in particular, 2 to 5 parts by weight from the viewpoint of increasing the density of a green compact.

The green compact may be sintered by any method.

Examples of the sintering include sintering in an electric furnace, sintering in a gas furnace, electrical heating, microwave sintering, millimeter-wave sintering, and hot isostatic pressing (HIP). The electric furnace and the gas furnace may be continuous furnaces or batch furnaces.

The sintering may be performed at any temperature and can be performed at a temperature allowing a reaction of each compound and sufficient growth of crystals. From the viewpoint of giving grains of the piezoelectric material having a grain diameter in the range of 0.3 to 100 μm, the sintering temperature can be 1050° C. or more and 1300° C. or less, such as 1100° C. or more and 1200° C. or less. The piezoelectric material sintered in such a temperature range shows satisfactory piezoelectric performance. In order to stably reproduce the properties of a piezoelectric material prepared by sintering treatment, the sintering is performed at a constant temperature within the above-mentioned range for 2 to 48 hours. Though sintering such as two-stage sintering may be employed, a rapid decrease in temperature should be avoided in light of productivity.

The sintered piezoelectric material may be heat-treated at a temperature not lower than the Curie temperature after polishing processing. Mechanical polishing generates a residual stress inside the piezoelectric material, but the heat treatment at a temperature not lower than the Curie temperature relieves the residual stress to further enhance the piezoelectric properties of the piezoelectric material. The heat treatment may be performed for any period of time, such as 1 hour or more.

If the crystal grains in the piezoelectric material of the present invention have a grain diameter exceeding 100 µm, strength sufficient for cutting and polishing processes may not be obtained. If the grain diameter is smaller than 0.3 µm, the piezoelectricity decreases. Accordingly, the grains can have an average grain diameter of 0.3 µm or more and 100 µm or less, in particular, 0.5 µm or more and 70 µm or less.

When the piezoelectric material of the present invention is used as a film formed on a substrate, the piezoelectric material can have a thickness of 200 nm or more and 10 µm or less, in particular, 300 nm or more and 3 µm or less. The piezoelectric material film having a thickness of 200 nm or more and 10 µm or less can provide an electromechanical conversion function sufficient as a piezoelectric element.

The films may be stacked by any method. Examples of the method include a chemical solution deposition method (CSD method), a sol-gel method, an metalorganic chemical vapor deposition method (MOCVD method), sputtering, a pulsed laser deposition method (PLD method), hydrothermal synthesis, and an aerosol deposition method (AD method). Among them, chemical solution deposition or sputtering can readily increase the area of the film to be formed. The substrate used for the piezoelectric material of the present invention can be a single-crystal substrate cut and polished in the (001) plane or (110) plane. The piezoelectric material film formed on the single-crystal substrate cut and polished in a specific crystal plane can also be highly oriented in the same direction.

An piezoelectric element including the piezoelectric material of the present invention will now be described.

FIG. 1 is a schematic diagram illustrating an embodiment of the configuration of a piezoelectric element of the present invention. The piezoelectric element according to the present invention at least includes a first electrode 1, a piezoelectric material portion 2, and a second electrode 3. The piezoelectric material constituting the piezoelectric material portion 2 is the piezoelectric material or piezoelectric ceramic of the present invention.

The piezoelectric properties of the piezoelectric material according to the present invention can be evaluated by being produced into a piezoelectric element at least having a first electrode and a second electrode. The first and the second electrodes are each a conductive layer having a thickness of about 5 to 2000 nm. The electrodes may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof.

The first and the second electrodes may be each made of any of these materials or may be each a multilayer made of two or more of these materials. The first and the second electrodes may be made of different materials.

The first and the second electrodes may be produced by any method and may be formed by, for example, baking of a metal paste, sputtering, or vapor deposition. The first and the second electrodes may be each patterned into a desired shape.

In the piezoelectric element, the polarization axes may be unidirectionally aligned. The unidirectionally aligned polarization axes increase the piezoelectric constant of the piezoelectric element.

The piezoelectric element may be polarized by any method. The polarization treatment may be performed in the atmosphere or in an oil. The polarization may be performed at a temperature of 60° C. to 160° C. The optimum conditions for the polarization slightly vary depending on the composition of the piezoelectric material constituting the element. The electric field applied in the polarization treatment can be higher than the coercive field of the material and is specifically 1 to 5 kV/mm.

The piezoelectric constant and the electromechanical quality factor of the piezoelectric element can be calculated based on Electronic Materials Manufacturers Association Standard (JEITA EM-4501) from the resonance frequency and the antiresonance frequency measured with a commercially available impedance analyzer. This method is hereinafter referred to as a resonance-antiresonance method.

A multilayered piezoelectric element including the piezoelectric material of the present invention will now be described.

The multilayered piezoelectric element according to the present invention is composed of alternately stacked piezoelectric material layers and electrodes including an internal electrode. The piezoelectric material layers are made of the piezoelectric material or the piezoelectric ceramic of the present invention.

Figure 2A:
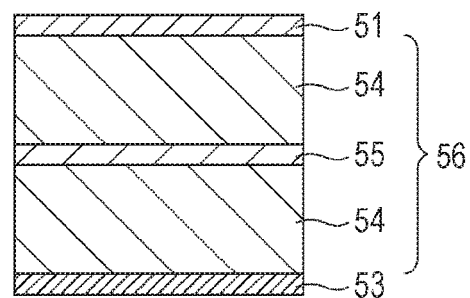
FIGS. 2A and 2B are schematic cross-sectional diagrams illustrating an embodiment of the configuration of a multi-layered piezoelectric element of the present invention.
Figure 2B:
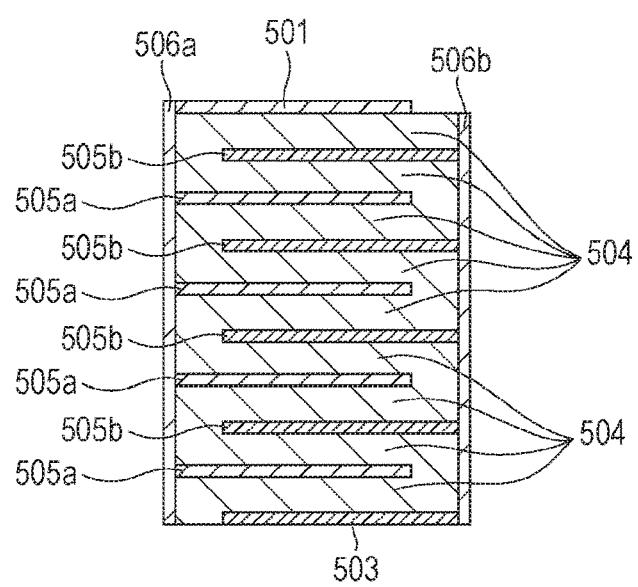

FIGS. 2A and 2B are schematic cross-sectional diagrams illustrating an embodiment of the configuration of a multilayered piezoelectric element of the present invention. The multilayered piezoelectric element according to the present invention is constituted of piezoelectric material layers 54 and electrodes including an internal electrode 55, where the piezoelectric material layers and the laminar electrodes are alternately stacked, and the piezoelectric material layers 54 are made of the piezoelectric material mentioned above. The electrodes may include external electrodes such as a first electrode 51 and a second electrode 53, in addition to the internal electrode 55.

FIG. 2A shows a configuration of a multilayered piezoelectric element 56 of the present invention, where two piezoelectric material layers 54 and one internal electrode 55 are alternately stacked, and the layered structure is disposed between the first electrode 51 and the second electrode 53. As shown in FIG. 2B, the numbers of the piezoelectric material layers and the internal electrodes may be increased, and the numbers are not limited. In the multilayered piezoelectric element shown in FIG. 2B, nine piezoelectric material layers 504 and eight internal electrodes 505 (505a or 505b) are alternately stacked, and the layered structure is disposed between the first electrode 501 and the second electrode 503. The multilayered piezoelectric element includes an external electrode 506a and an external electrode 506b for short-circuiting the alternately disposed internal electrodes.

The sizes and the shapes of the internal electrodes 55, 505 and the external electrodes 506a, 506b may not be necessarily the same as those of the piezoelectric material layers 54, 504 and may be divided into two or more pieces.

The internal electrodes 55, 505, the external electrodes 506a, 506b, the first electrodes 51, 501, and the second electrodes 53, 503 are each a conductive layer having a thickness of about 5 to 2000 nm and may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof. The internal electrodes 55, 505 and the external electrodes 506a, 506b may be each made of any one of these materials or a mixture or alloy of two or more of these materials or may be each a multilayer made of two or more of these materials. Two or more of these electrodes may be made of different materials. From the viewpoint of being inexpensive electrode materials, the internal electrodes 55, 505 can contain at least one of Ni and Cu. In a case of the internal electrodes 55, 505 containing at least one of Ni and Cu, the multilayered piezoelectric element of the present invention should be fired in a reducing atmosphere.

In the multilayered piezoelectric element of the present invention, the internal electrodes can each contain Ag and Pd, the weight ratio M1/M2 of the weight content M1 of the Ag to the weight content M2 of the Pd can be $1.5 \leq M1/M2 \leq 9.0$, such as $2.3 \leq M1/M2 \leq 4.0$. A weight ratio M1/M2 of less than 1.5 disadvantageously raises the sintering temperature of the internal electrode. In contrast, a weight ratio M1/M2 of higher than 9.0 forms an island-like internal electrode to make the surface uneven.

As shown in FIG. 2B, a plurality of electrodes including the internal electrodes 505 may be short-circuited to each other for adjusting the phase of the driving voltage. For example, the internal electrodes 505a and the first electrode 501 may be short-circuited with the external electrode 506a. The internal electrodes 505b and the second electrode 503 may be short-circuited with the external electrode 506b. The internal electrodes 505a and the internal electrodes 505b may be alternately disposed. The form of short-circuit between electrodes is not particularly limited. An electrode or wiring for short-circuit may be disposed on the side surface of the multilayered piezoelectric element. Alternatively, electrodes may be short-circuited with a conductive material disposed inside a through-hole formed so as to pass through the piezoelectric material layers 504.

A method of producing the multilayered piezoelectric element including the piezoelectric material of the present invention will now be described.

The method of producing a multilayered piezoelectric element of the present invention include a step (A) of preparing a slurry by dispersing a metal compound powder at least containing Na, Nb, Ba, Ti, and at least one element selected from Ni and Mn; a step (B) of preparing a green compact from the slurry; a step (C) of forming a layered product by forming an electrode on the green compact and alternately stacking the green compacts containing the metal compound and the electrodes; and a step (D) of preparing a multilayered piezoelectric element by sintering the layered product, wherein the sintering is performed at a sintering temperature of 1200° C. or less. The metal compound may contain copper. Throughout the specification, the term "powder" is intended to mean an assembly of solid grains and may be an assembly of grains containing Ba, Na, Ti, Nb, Ni, Cu, and Mn or may be an assembly of different types of grains containing arbitrary elements.

Examples of the metal compound powder in the step (A) include Ba compounds, Na compounds, Ti compounds, Nb compounds, Ni compounds, Cu compounds, and Mn compounds.

Usable examples of the Na compounds include sodium carbonate and sodium niobate.

Usable examples of the Ba compound include barium oxide, barium carbonate, barium oxalate, barium acetate, barium nitrate, and barium titanate.

Usable examples of the Ti compound include titanium oxide and barium titanate.

Usable examples of the Nb compound include niobium oxide and sodium niobate.

Usable examples of the Mn compound include manganese (IV) oxide, manganese(II) oxide, manganese(II) carbonate, manganese(II) acetate, manganese(II) nitrate, and manganese(II) oxalate.

Usable examples of the Ni compound include nickel(II) oxide, nickel(II) carbonate, nickel(II) acetate, nickel(II) nitrate, and nickel(II) oxalate.

Usable examples of the Cu compound include copper(I) oxide, copper(II) oxide, copper carbonate, copper(II) acetate, and copper oxalate.

An exemplary method of producing a slurry in the step (A) will be described. The metal compound powder is mixed with a solvent in an amount of 1.6 to 1.7 times the weight of the powder. The solvent can be, for example, toluene, ethanol, a solvent mixture of toluene and ethanol, n-butyl acetate, or water. The mixture is mixed with a ball mill for 24 hours, followed by addition of a binder and a plasticizer thereto. Examples of the binder include polyvinyl alcohol (PVA), polyvinyl butylal (PVB), and acrylic resins. In a case of using PVB as the binder, the PVB is weighed such that the weight ratio of the solvent to the PVB is, for example, 88:12. Examples of the plasticizer include dioctyl sebacate, dioctyl phthalate, and dibutyl phthalate. In a case of using dibutyl phthalate as the plasticizer, the plasticized is weighed in an amount that is the same as that of the binder. The mixture is mixed again with a ball mill overnight, and the amounts of the solvent and the binder are controlled such that the slurry has a viscosity of 300 to 500 mPa·s.

The green compact in the step (B) is a mixture of the metal compound powder, the binder, and the plasticizer in a sheet form. The green compact in the step (B) can be prepared by, for example, sheet molding. The sheet molding can be performed by, for example, a doctor blade method. The doctor blade method is a method for forming a sheet form compact by applying a slurry onto a base material with a doctor blade and drying the slurry. As the base material, for example, a PET film can be used. The compact can be readily detached from the PET film by coating the PET film with fluorine at the surface to which the slurry is applied. The drying may be natural drying or hot air drying. The compact may have any thickness and can be controlled depending on the thickness of the multilayered piezoelectric element. The thickness of the compact can be increased by, for example, increasing the viscosity of the slurry.

The electrodes in the step (C), i.e., the internal electrodes 505a, 505b and the external electrodes 506a, 506b may be produced by any method and may be formed by, for example, baking of a metal paste or by sputtering, vapor deposition, or printing. In order to reduce the driving voltage, the thickness and the pitch distance of the piezoelectric material layers 504 may be reduced. In such a case, a layered product including the precursor of the piezoelectric material layers 504 and the internal electrodes 505 is formed, and then the layered product is fired for simultaneously firing the piezoelectric material layers and the internal electrodes. Furthermore, the material for the internal electrodes is required not to cause a change in shape and a decrease in conductivity at the temperature necessary for sintering the piezoelectric material layers 504. A metal such as Ag, Pd, Au, Cu, or Ni, which has a lower melting point and is less expensive compared to Pt, or an alloy thereof can be used for the internal electrodes 505a, 505b and external electrodes 506a, 506b. The external electrodes 506a, 506b may be provided after firing of the layered product. In such a case, Al or a carbon-based electrode material can be used, in addition to Ag, Pd, Cu, or Ni.

The electrodes can be formed by screen printing. In the screen printing, a screen printing plate is placed on a compact disposed on a base material, and a metal paste is applied onto the compact through the screen printing plate with a spatula. The screen printing plate is at least partially provided with a screen mesh, and the metal paste is applied onto the compact through the screen mesh portion. A pattern can be formed in the screen mesh of the screen printing plate and can be transferred to the compact with the metal paste to pattern an electrode on the compact.

After formation of the electrodes in the step (C), one or a plurality of stacked compacts detached from the base material is pressure bonded to each electrode. Examples of the pressure bonding include uniaxial pressing, cold hydrostatic pressing, and hot hydrostatic pressing. The hot hydrostatic pressing can apply an isotropically uniform pressure. Good bonding can be achieved by increasing the temperature to around the glass transition temperature of the binder during the press bonding. A desired thickness can be obtained by stacking a plurality of green compacts and press bonding them. For example, the green compacts can be laminated through thermocompression bonding by stacking 10 to 100 green compacts and applying a pressure of 10 to 60 MPa in the laminating direction at 50° C. to 80° C. for 10 seconds to 10 minutes. A plurality of green compacts can be precisely laminated by placing alignment marks to the electrodes and adjusting alignment of the green compacts with the marks. The green compacts can also be precisely laminated by providing through-holes for positioning to the compacts.

In the step (D), a sintering temperature of 1200° C. or less allows the use of a metal such as Ag, Pd, Au, Cu, or Ni, which has a lower melting point and is less expensive compared to Pt, or an alloy thereof. In a case of using Ni or Cu for the electrodes, the sintering in the step (D) can be performed in a reducing atmosphere.

In the method of the multilayered piezoelectric element according to the present invention, the slurry can at least contain Ni and a perovskite-type metal oxide containing Ba, Na, Ti, and Nb. Examples of the perovskite-type metal oxide include sodium niobate and barium titanate. The slurry may further contain Cu in a form of copper(I) oxide or copper(II) oxide.

A slurry containing copper oxide enhances grain growth during sintering to increase the density of the sintered compact.

Liquid Discharge Head

Figure 3A:
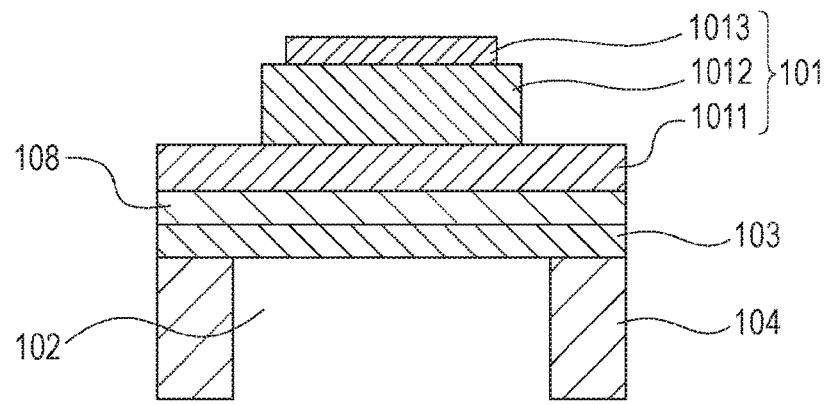
FIGS. 3A and 3B are schematic diagrams illustrating an embodiment of the configuration of a liquid discharge head of the present invention.
Figure 3B:
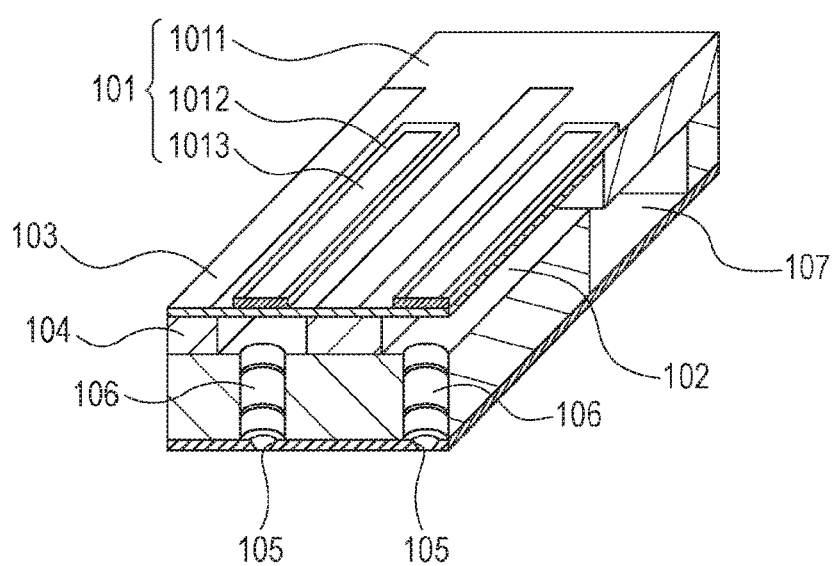

The liquid discharge head according to the present invention at least includes a liquid chamber having a vibratory unit including the piezoelectric element or the multilayered piezoelectric element and a discharge port communicating with the liquid chamber. The liquid to be discharged with the liquid discharge head of the present invention may be any fluid, and the liquid discharge head can discharge an aqueous solution such as water, ink, fuel or a non-aqueous solution. FIGS. 3A and 3B are schematic diagrams illustrating an embodiment of the configuration of a liquid discharge head of the present invention. As shown in FIGS. 3A and 3B, the liquid discharge head of the present invention includes a piezoelectric element 101 of the present invention. The piezoelectric element 101 at least includes a first electrode 1011, a piezoelectric material 1012, and a second electrode 1013. The piezoelectric material 1012 is optionally patterned as shown in FIG. 3B.

FIG. 3B is a schematic diagram of a liquid discharge head. The liquid discharge head includes discharge ports 105, individual liquid chambers 102, communication holes 106 connecting the individual liquid chambers 102 to the corresponding discharge ports 105, liquid chamber partitions 104, a common liquid chamber 107, diaphragms 103, and piezoelectric elements 101. The piezoelectric element 101 shown in the drawing has a rectangular shape, but has any shape such as an elliptical, circular, or parallelogram shape. In general, the piezoelectric material 1012 has a shape along the shape of the individual liquid chamber 102.

The vicinity of the piezoelectric element 101 in the liquid discharge head of the present invention will be described in detail with reference to FIG. 3A. FIG. 3A is a cross-sectional view of the piezoelectric element shown in FIG. 3B in the width direction. The cross section of the piezoelectric element 101 is rectangular, but may be trapezoidal or reverse trapezoidal. In the drawing, the first electrode 1011 is used as a lower electrode, and the second electrode 1013 is used as an upper electrode. The arrangement of the first electrode 1011 and the second electrode 1013 is not limited to this. For example, the first electrode 1011 may be used as a lower electrode or an upper electrode. Likewise, the second electrode 1013 may be used as an upper electrode or a lower electrode. In addition, a buffer layer 108 may be disposed between the diaphragm 103 and the lower electrode. These differences in name are due to the difference in method of producing the devices, and all of them can provide the effects of the present invention.

In the liquid discharge head, the diaphragm 103 vibrates up and down by the expansion and contraction of the piezoelectric material 1012 and applies a pressure to the liquid in the individual liquid chamber 102. As a result, the liquid is discharged from the discharge port 105. The liquid discharge head of the present invention can be used in printers or can be applied to production of electronic devices. The diaphragm 103 can have a thickness of 1.0 µm or more and 15 µm or less, such as 1.5 µm or more and 8 µm or less. The diaphragm may be made of any material. For example, the diaphragm may be made of Si, and Si of the diaphragm may be doped with boron or phosphorus. In addition, the buffer layer or the electrode layer on the diaphragm may be a part of the diaphragm. The buffer layer 108 may have a thickness of 5 nm or more and 300 nm or less, such as 10 nm or more and 200 nm or less. The discharge port 105 has a size of 5 µm or more and 40 µm or less as the equivalent circular diameter. The shape of the discharge port 105 may be circular or a star, square, or triangle shape.

Liquid Discharge Device

The liquid discharge device of the present invention will now be described. The liquid discharge device of the present invention includes a conveying unit for conveying a recording medium and the liquid discharge head.

Figure 4:
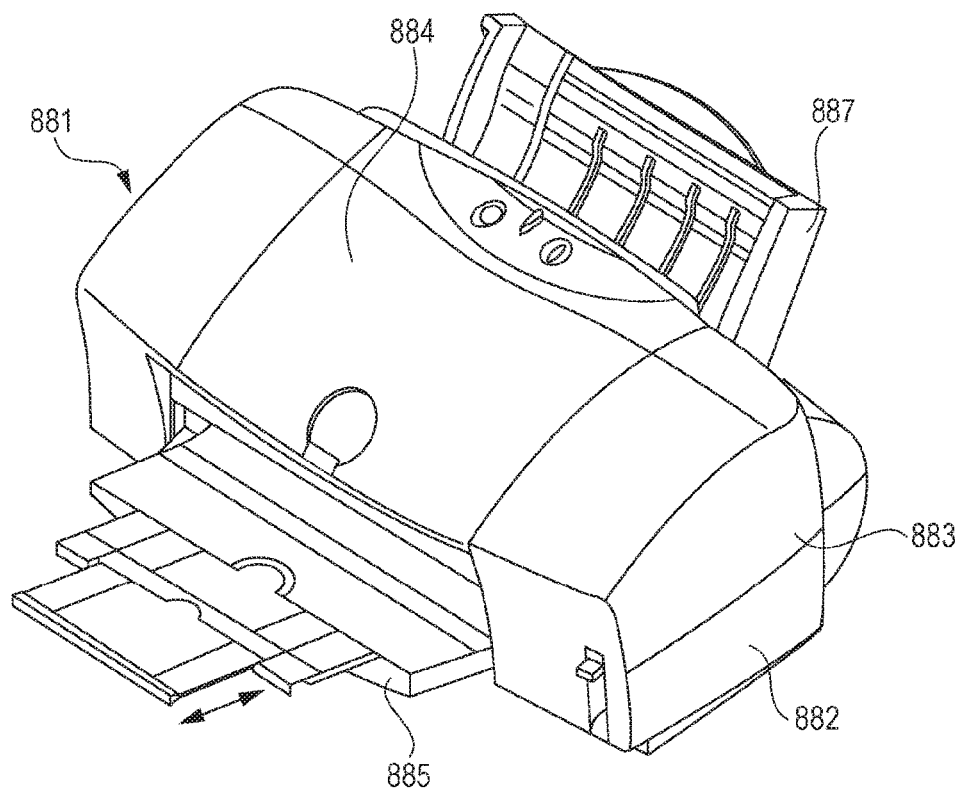
FIG. 4 is a schematic diagram illustrating an embodiment of a liquid discharge device of the present invention.
Figure 5:
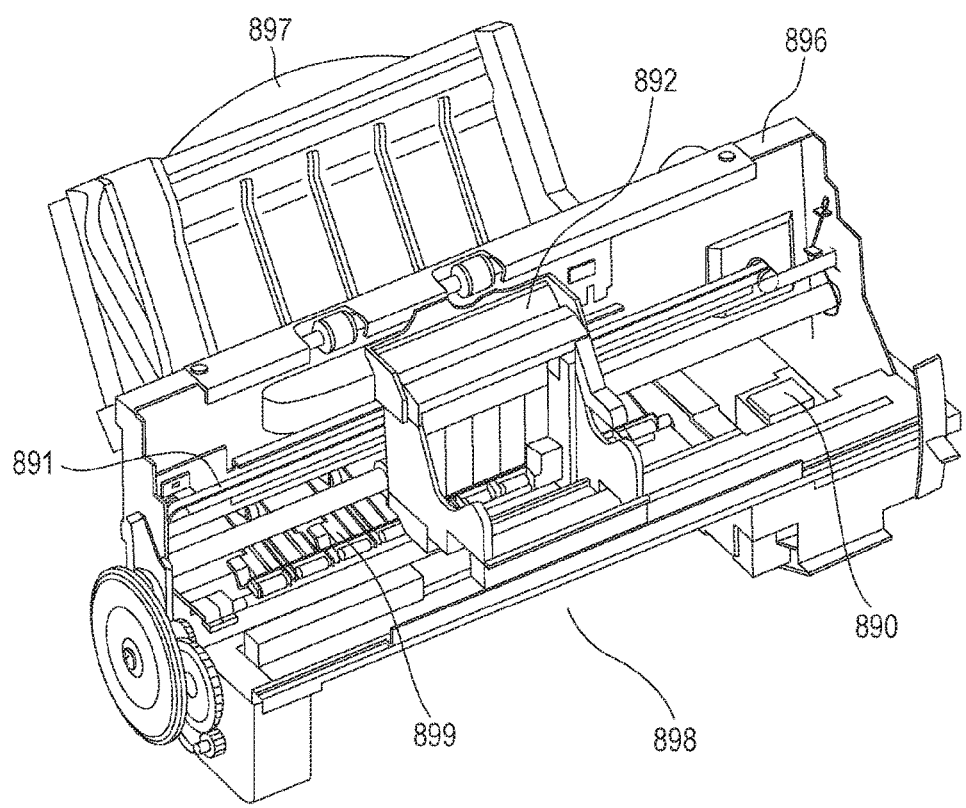
FIG. 5 is a schematic diagram illustrating an embodiment of a liquid discharge device of the present invention.

The ink-jet recording apparatus shown in FIGS. 4 and 5 is an example of the liquid discharge device of the present invention. FIG. 5 shows the liquid discharge device (ink-jet recording apparatus) 881 shown in FIG. 4 in a state where the exteriors 882 to 885 and 887 are removed. The ink-jet recording apparatus 881 includes an automatic feeder 897 for automatically feeding recoding paper as a recording medium to the device main body 896. Furthermore, the ink-jet recording apparatus 881 includes a conveying unit 899 for conveying the recording paper fed from the automatic feeder 897 to a predetermined recording position and then conveying the recording paper from the recording position to the ejection port 898; a recording portion 891 for performing recording onto the recording paper conveyed to the recording position; and a recovering portion 890 for performing recovering treatment to the recording portion 891. The recording portion 891 is provided with a carriage 892 that receives the liquid discharge head of the present invention and moves on a rail in a reciprocating motion.

In such an ink-jet recording apparatus, the carriage 892 slides on the rail according to the electric signals sent from a computer, and the piezoelectric material is displaced by application of a driving voltage to the electrodes between which the piezoelectric material is disposed. The displacement of the piezoelectric material applies a pressure to the individual liquid chamber 102 via the diaphragm 103 shown in FIG. 3B and thereby an ink is discharged from the discharge port 105 to perform printing. In the liquid discharge device of the present invention, it is possible to uniformly discharge a liquid at high speed and to reduce the size of the device.

The above-described example of the liquid discharge device is a printer, but the liquid discharge device of the present invention can be used as not only printing apparatuses including ink-jet recording apparatuses, such as a facsimile machine, a multifunction machine, or a copier, but also as a liquid discharge device in industrial use and a drawing apparatuses for objects.

Ultrasonic Motor

Figure 6A:
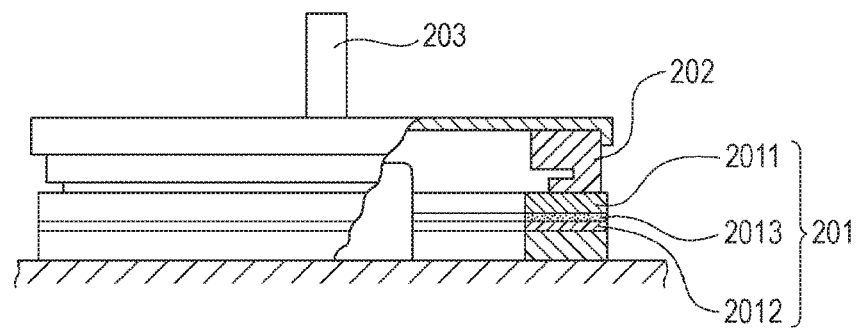
FIGS. 6A and 6B are schematic diagrams illustrating an embodiment of the configuration of an ultrasonic motor of the present invention.
Figure 6B:
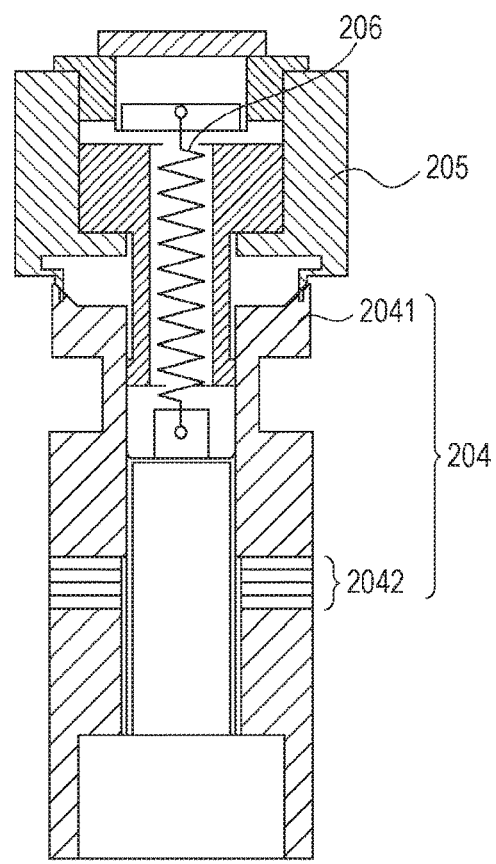

The ultrasonic motor according to the present invention at least includes a vibratory component including the piezoelectric element or the multilayered piezoelectric element and a movable component being in contact with the vibratory component. FIGS. 6A and 6B are schematic diagrams illustrating an embodiment of the configuration of an ultrasonic motor of the present invention. FIG. 6A shows an ultrasonic motor of which piezoelectric element of the present invention is a single plate. The ultrasonic motor includes an oscillator 201, a rotor 202 being in contact with the sliding surface of the oscillator 201 by means of a pressure applied by a spring (not shown), and an output shaft 203 disposed integrally with the rotor 202. The oscillator 201 is composed of a metal elastic ring 2011, a piezoelectric element 2012 of the present invention, and an organic adhesive (e.g., epoxy or cyanoacrylate adhesive) 2013 for bonding the piezoelectric element 2012 to the elastic ring 2011. The piezoelectric element 2012 of the present invention is constituted of a first electrode, a second electrode (both are not shown), and the piezoelectric material disposed therebetween. When alternating voltage different in phase by odd number times π/4 is applied to the piezoelectric element of the present invention, flexural traveling waves are generated in the oscillator 201, and each point on the sliding surface of the oscillator 201 moves in an elliptic motion. The rotor 202 pressed to the sliding surface of the oscillator 201 receives a frictional force from the oscillator 201 to rotate in the direction opposite to the flexural traveling waves. The object (not shown) to be driven is connected to the output shaft 203 and is driven by the turning force of the rotor 202. A piezoelectric material to which a voltage applied expands and contracts by the transverse piezoelectric effect. When an elastic material such as a metal is in contact with the piezoelectric element, the elastic material is bent by the expansion and contraction of the piezoelectric material. The ultrasonic motor described here utilizes this principle. FIG. 6B shows an example of an ultrasonic motor including a piezoelectric element having a layered structure. The oscillator 204 is composed of a tubular metal elastic bodies 2041 and a multilayered piezoelectric element 2042 disposed between the elastic bodies. The multilayered piezoelectric element 2042 is constituted of a plurality of stacked piezoelectric materials (not shown) and includes first and second electrodes on the outer surfaces of the stacked piezoelectric materials and internal electrodes between the stacked piezoelectric materials. The metal elastic bodies 2041 are connected to each other with a bolt to fix the piezoelectric element 2042 therebetween to form the oscillator 204. When alternating voltage different in phase is applied to the piezoelectric element 2042, the oscillator 204 generates two vibrations rectangular to each other. The two vibrations are combined to create a circular vibration for driving the end portion of the oscillator 204. The oscillator 204 is provided with a circumferential groove at the upper portion to enlarge the vibration for driving. The rotor 205 is in pressurized contact with the oscillator 204 by means of the pressurizing spring 206 to create a frictional force for driving. The rotor 205 is rotatably supported by bearing.

Optical Apparatus

The optical apparatus of the present invention will now be described. The optical apparatus of the present invention includes the ultrasonic motor in the driving unit.

Figure 7A:
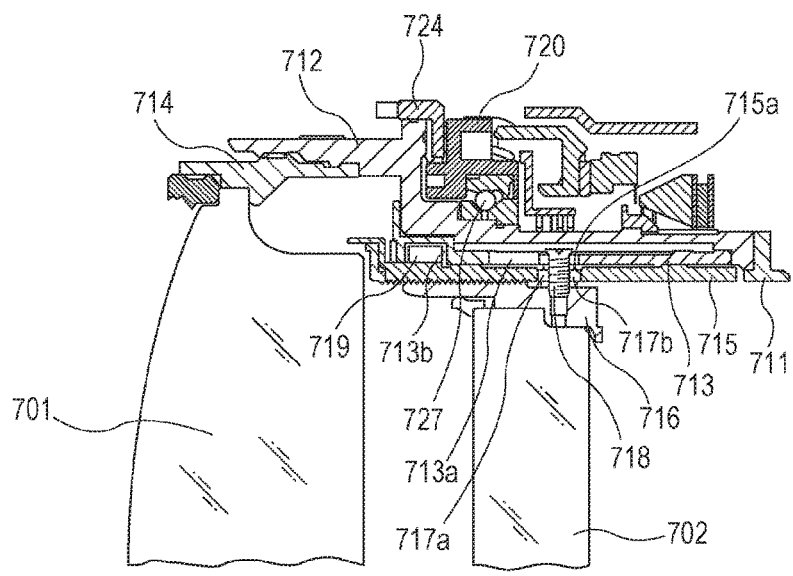
FIGS. 7A and 7B are schematic diagrams illustrating an embodiment of an optical apparatus of the present invention.
Figure 7B:
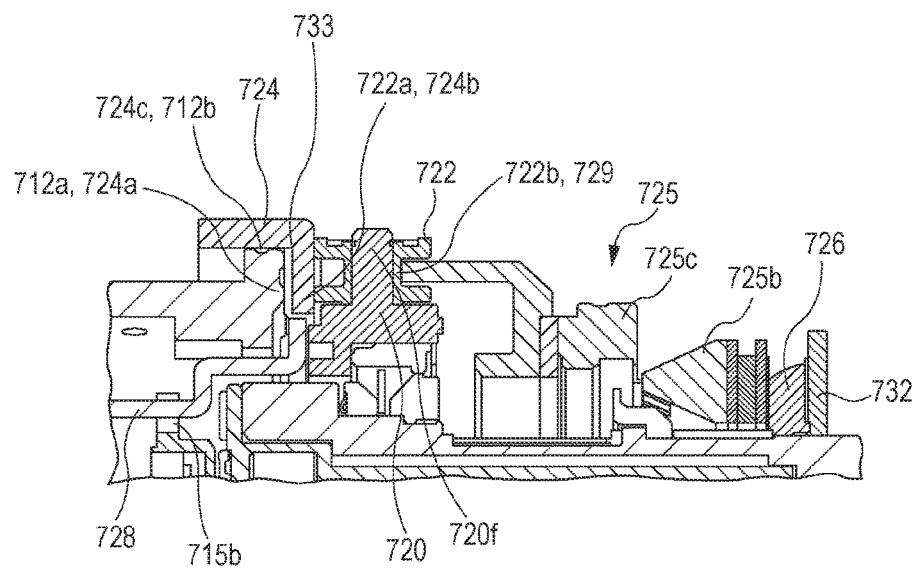
Figure 8:
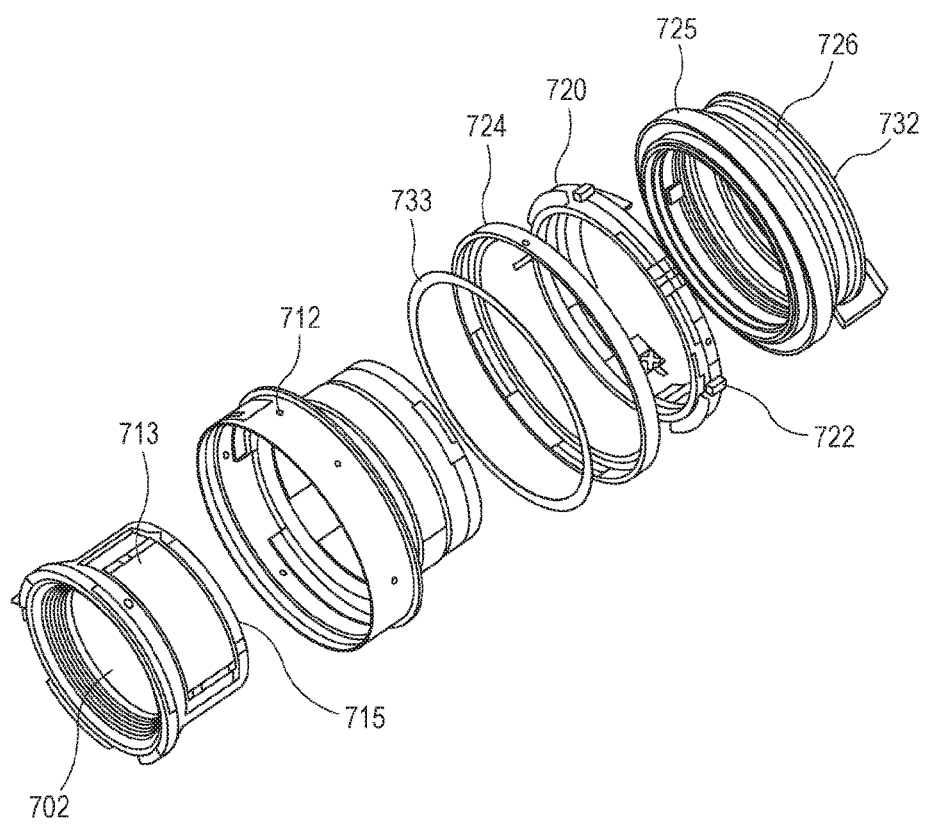
FIG. 8 is a schematic diagram illustrating an embodiment of an optical apparatus of the present invention.

FIGS. 7A and 7B are main cross-sectional views of an interchangeable lens barrel of a single lens reflex camera as an embodiment of the image pickup device of the present invention. FIG. 8 is an exploded perspective view of an interchangeable lens barrel of a single lens reflex camera as an embodiment of the image pickup device of the present invention. A fixing barrel 712, a linear guide barrel 713, and a front lens group barrel 714 are fixed to the detachable mount 711 with a camera. These barrels are fixing members of the interchangeable lens barrel.

The linear guide barrel 713 is provided with a forward guide groove 713a for the focus lens 702 in the optical axis direction. Cam rollers 717a and 717b protruding to the outside in the diameter direction are fixed, with an axial screw 718, to the rear lens group barrel 716 holding the focus lens 702. The cam roller 717a fits in the forward guide groove 713a.

A cam ring 715 turnably fits in the inner circumference of the linear guide barrel 713. Relative displacement between the linear guide barrel 713 and the cam ring 715 is restricted in the optical axis direction by fitting the roller 719 fixed to the cam ring 715 in the circumferential groove 713b of the linear guide barrel 713. The cam ring 715 is provided with a cam groove 715a for the focus lens 702, and the cam roller 717b also fits in the cam groove 715a.

A rotation transmitting ring 720 is disposed on the outer circumference side of the fixing barrel 712 and is held by a ball race 727 so as to be turnable at a fixed position with respect to the fixing barrel 712. The rotation transmitting ring 720 has a shaft 720f radially extending from the rotation transmitting ring 720, and a driven roller 722 is turnably held by the shaft 720f. The large-diameter portion 722a of the driven roller 722 is in contact with the mount side end face 724b of the manual focus ring 724. The small-diameter portion 722b of the driven roller 722 is in contact with a connecting member 729. Six driven rollers 722 are disposed on the outer circumference of the rotation transmitting ring 720 at equal intervals, and each driven roller is disposed as described above.

Low friction sheet (washer member) 733 is disposed at the inner diameter portion of the manual focus ring 724 so as to be held between the mount side end face 712a of the fixing barrel 712 and the front side end face 724a of the manual focus ring 724. The outer diameter surface of the low friction sheet 733 is in a ring shape and fits in the inner diameter portion 724c of the manual focus ring 724, and the inner diameter portion 724c of the manual focus ring 724 further fits in the outer diameter portion 712b of the fixing barrel 712. The low friction sheet 733 reduces the friction in the turning ring mechanism for relatively turning the manual focus ring 724 with respect to the fixing barrel 712 around the optical axis.

The large-diameter portion 722a of the driven roller 722 and the mount side end face 724a of the manual focus ring are in contact with each other with the pressure applied by the force of a wave washer 726 for pressing the ultrasonic motor 725 toward the front of the lens. Similarly, the small-diameter portion 722b of the driven roller 722 and the connecting member 729 are in contact with each other by the force of the wave washer 726 for pressing the ultrasonic motor 725 toward the front of the lens. The wave washer 726 is restricted in the movement toward the mount direction by a washer 732 bayonet-connected to the fixing barrel 712. The spring force (biasing force) generated by the wave washer 726 is transmitted to the ultrasonic motor 725 and further to the driven roller 722 and thereby also serves as a pressing force against the mount side end face 712a of the fixing barrel 712 by the manual focus ring 724. That is, the manual focus ring 724 is incorporated so as to be pressed to the mount side end face 712a of the fixing barrel 712 via the low friction sheet 733.

Consequently, when the ultrasonic motor 725 is driven so as to turn with respect to the fixing barrel 712 by controller (not shown), since the connecting member 729 is in a frictional contact with the small-diameter portion 722b of the driven roller 722, the driven roller 722 turns around the shaft 720f. The turning of the driven roller 722 around the shaft 720f results in turning of the rotation transmitting ring 720 around the optical axis (autofocus operation).

When a turning force around the optical axis is applied to the manual focus ring 724 from a manual manipulation input unit (not shown), the mount side end face 724b of the manual focus ring 724 is brought into a pressing-contact with the large-diameter portion 722a of the driven roller 722. As a result, the driven roller 722 turns around the shaft 720f by the frictional force. The turning of the large-diameter portion 722a of the driven roller 722 around the shaft 720f turns the rotation transmitting ring 720 around the optical axis. On this occasion, the friction holding power of a rotor 725c and a stator 725b prevents the ultrasonic motor 725 from being turned (manual focus operation).

The rotation transmitting ring 720 is provided with two focus keys 728 at positions to oppose each other. The focus keys 728 fit in the notches 715b formed at the end portion of the cam ring 715. Consequently, turning of the rotation transmitting ring 720 around the optical axis by the autofocus operation or the manual focus operation is transmitted to the cam ring 715 via the focus keys 728 to turn the cum ring around the optical axis. As a result, the rear lens group barrel 716 that is restricted in turning by the cam roller 717a and the forward guide groove 713a moves along the cam groove 715a of the cam ring 715 by the cam roller 717b. Thus, the focus lens 702 is driven to perform focus operation.

Here, an interchangeable lens barrel of a single lens reflex camera has been described as an example of the optical apparatus of the present invention. The present invention can be applied to any optical apparatus having an ultrasonic motor in the driving unit, such as a compact camera, an electronic still camera, or a portable terminal with a camera, regardless of the types of cameras. Vibratory device and dust removing device Vibratory devices for, for example, conveying or removing particles, powder, or a liquid are widely used in electronic apparatuses.

A dust removing device including the piezoelectric material of the present invention will now be described as an example of the vibratory device of the present invention.

The dust removing device according to the present invention includes a vibratory component provided with the piezoelectric element or the multilayered piezoelectric element.

Figure 9A:
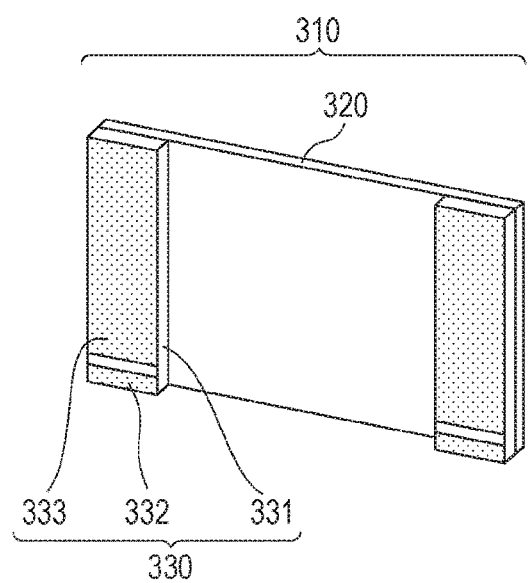
FIGS. 9A and 9B are schematic diagrams illustrating an embodiment when a vibratory device of the present invention is used as a dust removing device.
Figure 9B:
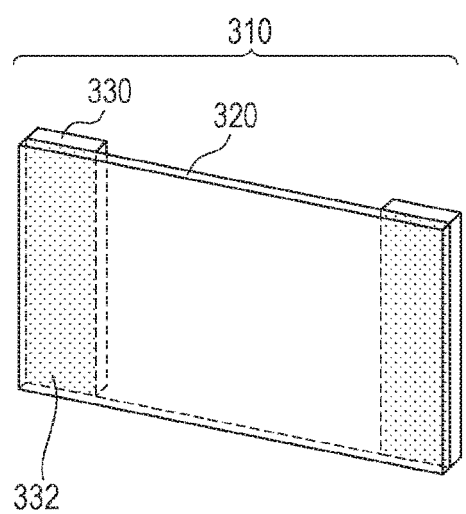

FIGS. 9A and 9B are schematic diagrams illustrating an embodiment of the dust removing device of the present invention. The dust removing device 310 is constituted of a tabular piezoelectric element 330 and a diaphragm 320. The piezoelectric element 330 may be a multilayered piezoelectric element of the present invention. The diaphragm 320 may be made of any material. When the dust removing device 310 is used in an optical device, a transparent material or a light-reflective material can be used as the diaphragm 320.

Figure 10A:
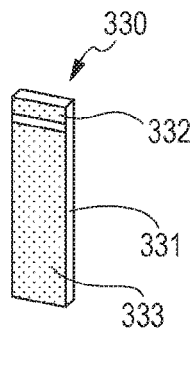
FIGS. 10A to 10C are schematic diagrams illustrating the configuration of a piezoelectric element in a dust removing device of the present invention.
Figure 10B:
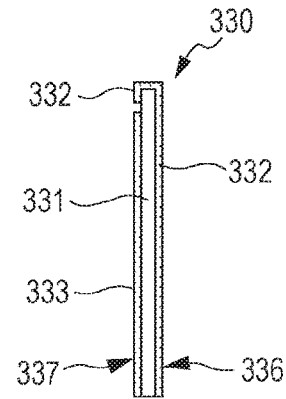
Figure 10C:
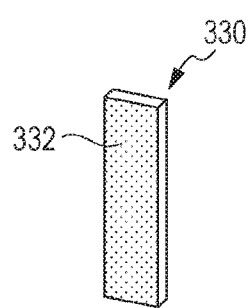

FIGS. 10A to 10C are schematic diagrams illustrating the configuration of a piezoelectric element 330 shown in FIGS. 9A and 9B. FIGS. 10A and 10C illustrate the structures of the front and the rear faces of the piezoelectric element 330, and FIG. 10B illustrates the structure of the side face. As shown in FIGS. 9A and 9B, the piezoelectric element 330 is composed of a piezoelectric material 331, a first electrode 332, and a second electrode 333, and the first electrode 332 and the second electrode 333 are respectively arranged on the surfaces of the tabular piezoelectric material 331 so as to oppose each other. As in the piezoelectric element shown in FIGS. 9A and 9B, the piezoelectric element 330 may be a multilayered piezoelectric element of the present invention. In such a case, the piezoelectric material 331 has a structure having piezoelectric material layers and internal electrodes alternately arranged, and the internal electrodes are alternately short-circuited with the first electrode 332 or the second electrode 333 to give a driving waveform to each layer of the piezoelectric material with different phases. The face of the first electrode 332 of the piezoelectric element 330 shown in FIG. 10C is a first electrode face 336, and the face of the second electrode 333 of the piezoelectric element 330 shown in FIG. 10A is a second electrode face 337.

Here, the electrode face in the present invention indicates the face of the piezoelectric element on which the electrode is disposed. For example, as shown in FIGS. 10A to 10C, the first electrode 332 may go around to the second electrode face 337.

As shown in FIGS. 9A and 9B, the first electrode face 336 of the piezoelectric element 330 is fixed to the plate face of the diaphragm 320. Stress is generated between the piezoelectric element 330 and the diaphragm 320 by driving the piezoelectric element 330 to generate out-of-plane vibration in the diaphragm. The dust removing device 310 of the present invention is a device for removing foreign substance such as dust adhered to the surface of the diaphragm 320 by the out-of-plane vibration of the diaphragm 320. The term "out-of-plane vibration" refers to elastic vibration that displaces the diaphragm in the optical axis direction, i.e., in the thickness direction of the diaphragm.

Figure 11A:
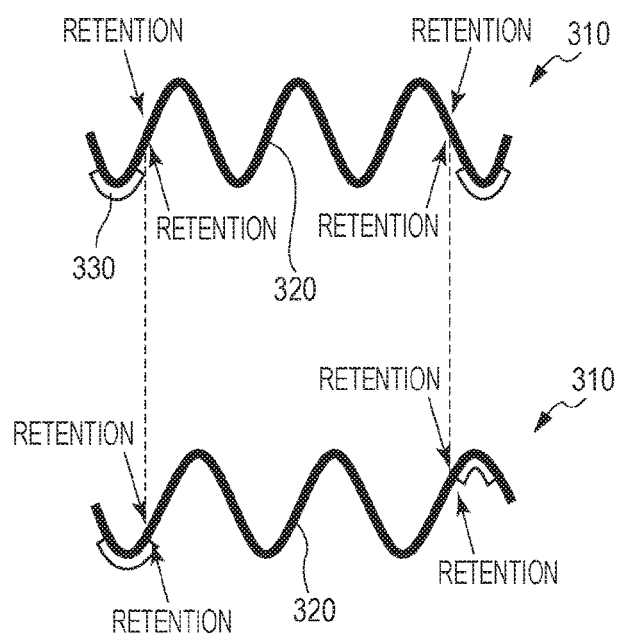
FIGS. 11A and 11B are schematic diagrams illustrating the vibration principle of a dust removing device of the present invention.
Figure 11B:
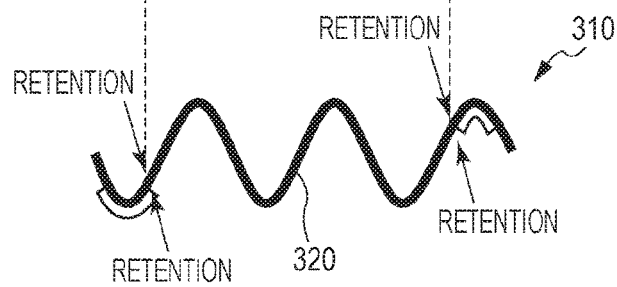

FIGS. 11A and 11B are schematic diagrams illustrating the vibration principle of the dust removing device 310 of the present invention. FIG. 11A shows a state of generating out-of-plane vibration in the diaphragm 320 by applying in-phase alternating electric fields to a pair of piezoelectric elements 330. The polarization direction of the piezoelectric material constituting the pair of piezoelectric elements 330 is identical with the thickness direction of the piezoelectric elements 330. The dust removing device 310 is driven by a seventh vibration mode. FIG. 11B shows a state of generating out-of-plane vibration in the diaphragm 320 by applying reverse-phase alternating voltages having phases opposite by 180° to a pair of piezoelectric elements 330. The dust removing device 310 is driven by a sixth vibration mode. The dust removing device 310 of the present invention can effectively remove dust adhered to the surface of a diaphragm by properly using at least two vibration modes.

Image Pickup Device

Figure 12:
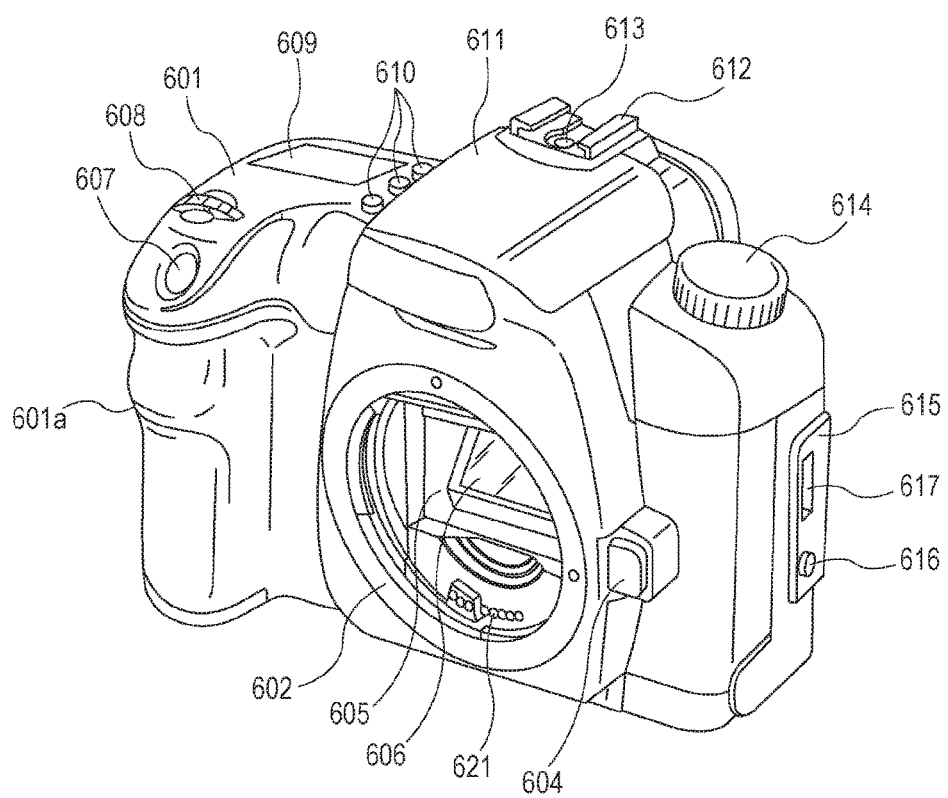
FIG. 12 is a schematic diagram illustrating an embodiment of an image pickup device of the present invention.
Figure 13:
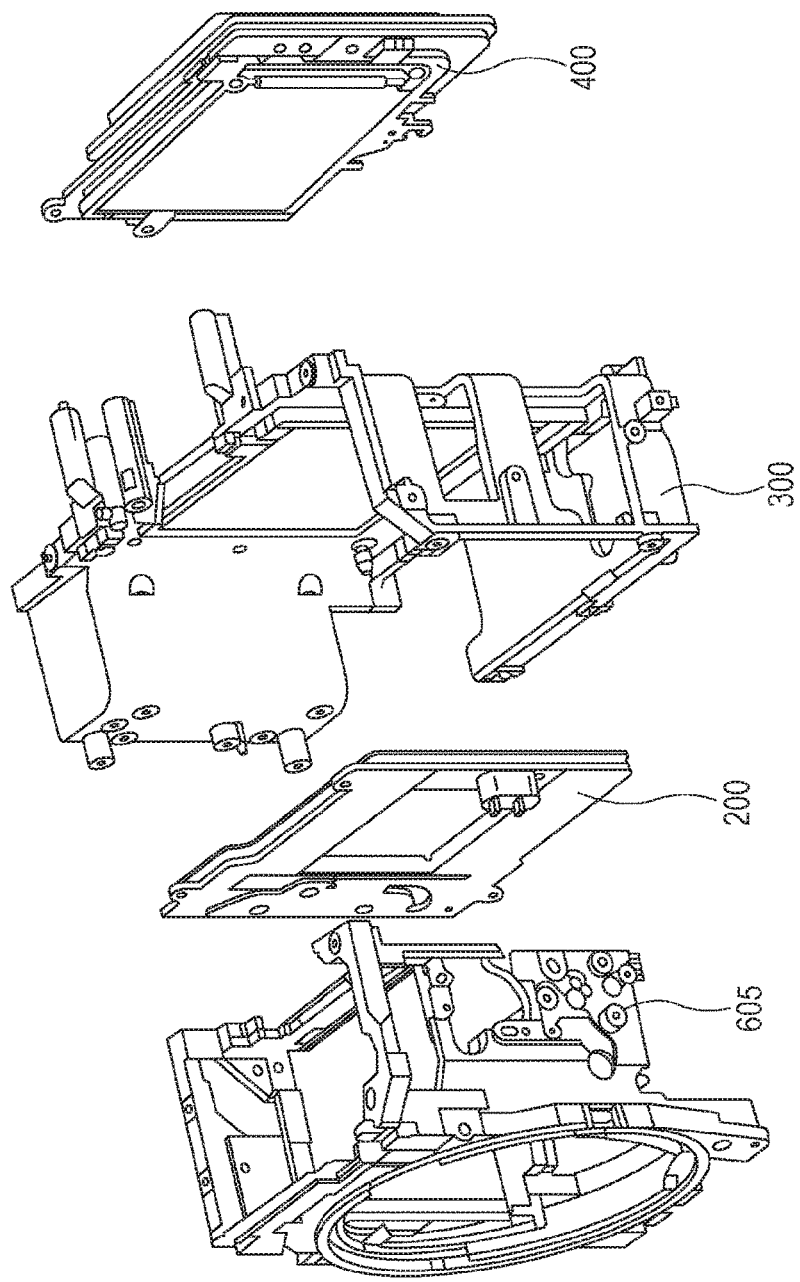
FIG. 13 is a schematic diagram illustrating an embodiment of an image pickup device of the present invention.

The image pickup device of the present invention will now be described. The image pickup device of the present invention at least includes the dust removing device and an image pickup element unit. The dust removing device has a diaphragm disposed on the light-receiving surface side of the image pickup element unit. FIGS. 12 and 13 are diagrams illustrating a digital single lens reflex camera as an embodiment of the image pickup device of the present invention.

FIG. 12 is a front perspective view of a camera body 601 viewed from the object side, in a state in which the image pickup lens unit is removed. FIG. 13 is an exploded perspective view illustrating the schematic structure of the inside of the camera for describing the dust removing device of the present invention and the surrounding structure of a pickup unit 400.

A mirror box 605 into which image pickup light beams that passed through the image pickup lens are guided is disposed inside the camera body 601. Main mirror (quick return mirror) 606 is disposed inside the mirror box 605. The main mirror 606 can take a state in which the main mirror 606 is held at an angle of 45° with respect to the image pickup optical axis for guiding image pickup light beams to the direction of the penta roof mirror (not shown) and a state in which the main mirror 606 is held at a position evacuated from image pickup light beams for guiding the image pickup light beams to the direction of the image pickup element (not shown).

The mirror box 605 and a shutter unit 200 are disposed on the object side of the body chassis 300 serving as the skeleton of the camera body in this order from the object side. Furthermore, an image pickup unit 400 is disposed on the photographer side of the body chassis 300. The image pickup unit 400 is set to the clamp face of the mount portion 602 serving as the basis for setting the image pickup lens unit such that the image pickup face of the image pickup element is parallel to the clamp face with a predetermined distance therebetween.

Herein, a digital single lens reflex camera has been described as an example of the image pickup device of the present invention. The image pickup device may be, for example, an image pickup lens interchangeable camera such as a mirror-less digital single lens camera not having the mirror box 605. The present invention can also be applied to any apparatus required to remove dust adhering to the surfaces of, in particular, the optical parts of various image pickup devices, such as image pickup unit interchangeable video cameras, copiers, facsimile machines, and scanners, and electronic electric apparatuses having image pickup devices.

Electronic Apparatus

The electronic apparatus of the present invention will now be described. The electronic apparatus of the present invention includes a piezoelectric acoustic component having the piezoelectric element or the multilayered piezoelectric element. Examples of the piezoelectric acoustic component include loudspeakers, buzzers, microphones, and surface acoustic wave (SAW) elements.

Figure 14:
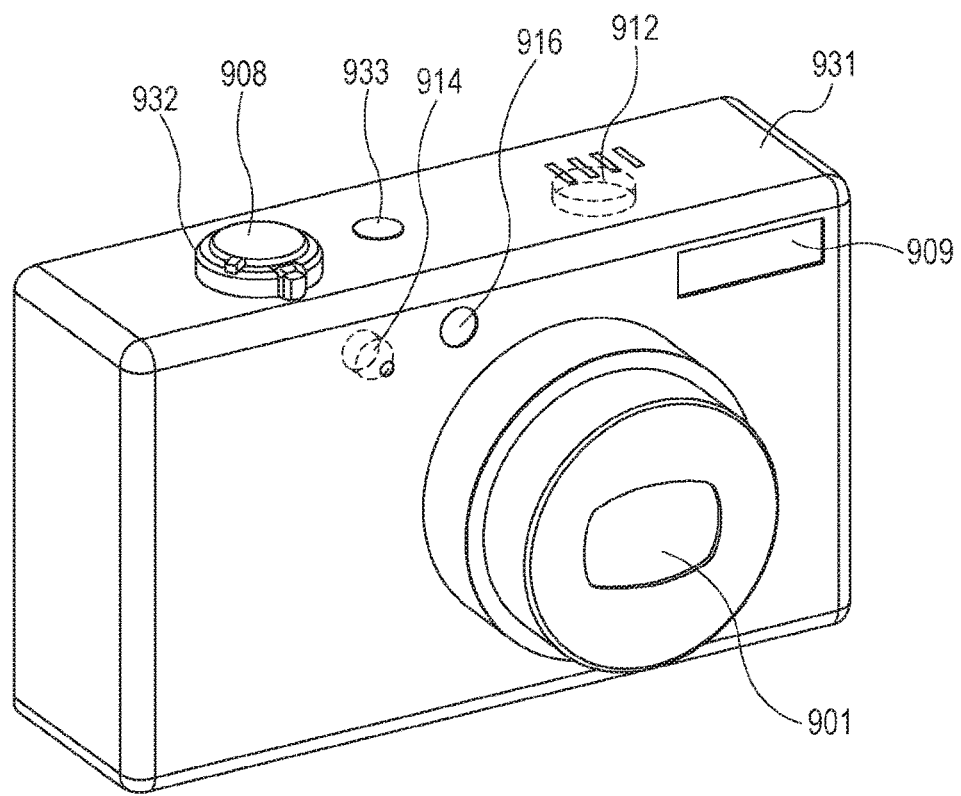
FIG. 14 is a schematic diagram illustrating an embodiment of an electronic apparatus of the present invention.

FIG. 14 is a perspective general view of a digital camera body 931, an embodiment of the electronic apparatus of the present invention, viewed from the front. An optical device 901, a microphone 914, a stroboscope light emitting unit 909, and an assist light unit 916 are disposed on the front of the body 931. The microphone 914 is incorporated in the inside of the body and is therefore indicated by a dashed line. A hole is provided in the body on the front of the microphone 914 for picking up sounds from the outside.

On the upper face of the body 931, a power button 933, a loudspeaker 912, a zoom lever 932, and a release button 908 for performing the focusing operation are arranged. The loudspeaker 912 is incorporated in the inside of the body 931 and is therefore indicated by a dashed line. Holes are provided in the body on the front of the loudspeaker 912 for transmitting sounds to the outside.

The piezoelectric acoustic component of the present invention is used in at least one of the microphone 914, the loudspeaker 912, and the surface acoustic wave element.

Herein, a digital camera has been described as the electronic apparatus of the present invention. The present invention can also be applied to electronic apparatuses having various piezoelectric acoustic components such as sound reproducers, recorders, cellular phones, and information terminals.

As described above, the piezoelectric element or the multilayered piezoelectric element of the present invention can be suitably applied to liquid discharge heads, liquid discharge devices, ultrasonic motors, optical apparatuses, vibratory devices, dust removing devices, image pickup devices, and electronic apparatuses. The use of the piezoelectric element or the multilayered piezoelectric element of the present invention can provide a liquid discharge head having a nozzle density and a discharge rate that are equivalent to or higher than those in the case of using a piezoelectric element containing lead.

The use of the liquid discharge head of the present invention can provide a liquid discharge device having a discharge rate and a discharge precision that are equivalent to or higher than those in the case of using a piezoelectric element containing lead. The use of the piezoelectric element or the multilayered piezoelectric element of the present invention can provide an ultrasonic motor having a driving power and durability that are equivalent to or higher than those in the case of using a piezoelectric element containing lead.

The use of the ultrasonic motor of the present invention can provide an optical apparatus having durability and an operation precision that are equivalent to or higher than those in the case of using a piezoelectric element containing lead.

The use of the piezoelectric element or the multilayered piezoelectric element of the present invention can provide a vibratory device having a vibration ability and durability that are equivalent to or higher than those in the case of using a piezoelectric element containing lead.

The use of the vibratory device of the present invention can provide a dust removing device having a dust removing efficiency and durability that are equivalent to or higher than those in the case of using a piezoelectric element containing lead.

The use of the dust removing device of the present invention can provide an image pickup device having a dust removing function that is equivalent to or higher than that in the case of using a piezoelectric element containing lead.

The use of a piezoelectric acoustic component including the piezoelectric element or the multilayered piezoelectric element of the present invention can provide an electronic apparatus having a sound-producing ability that is equivalent to or higher than that in the case of using a piezoelectric element containing lead.

The piezoelectric material of the present invention can be used not only in liquid discharge heads and motors but also in devices such as ultrasonic vibrators, piezoelectric actuators, piezoelectric sensors, and ferroelectric memories.

EXAMPLES

The piezoelectric material of the present invention will now be more specifically described by Examples, but the present invention is not limited to the following Examples.

Table 1 shows the sintered compacts of Examples 1 to 17 of the present invention and of Comparative Examples 1 to 4. In the table, x denotes the abundance of Na, y denotes the abundance of Nb, z denotes the abundance of Ni, v denotes the abundance of Cu, and w denotes the abundance of Mn. As a change in composition after sintering, only the x/y ratio is shown. In the sintered compacts of Examples 1 to 17 and Comparative Examples 1, 2, and 4, the x/y ratio before sintering was 1, but in the sintered compact of Comparative Example 3, the x/y ratio before sintering was 1.03.

TABLE 1

| Sample | x/y | x | y | z | v | w |
|---|---|---|---|---|---|---|
| Example 1 | 0.97 | 0.85 | 0.88 | 0.002 | 0 | 0 |
| Example 2 | 0.97 | 0.85 | 0.88 | 0.005 | 0 | 0 |
| Example 3 | 0.97 | 0.85 | 0.88 | 0.007 | 0 | 0 |
| Example 4 | 0.97 | 0.85 | 0.88 | 0.01 | 0 | 0 |
| Example 5 | 0.98 | 0.86 | 0.88 | 0.005 | 0.002 | 0 |
| Example 6 | 0.96 | 0.84 | 0.88 | 0.005 | 0.005 | 0 |
| Example 7 | 0.97 | 0.85 | 0.88 | 0.005 | 0 | 0.002 |
| Example 8 | 0.97 | 0.85 | 0.88 | 0.005 | 0 | 0.005 |
| Example 9 | 0.97 | 0.87 | 0.90 | 0.005 | 0 | 0 |
| Example 10 | 0.97 | 0.82 | 0.85 | 0.005 | 0 | 0 |
| Example 11 | 0.98 | 0.86 | 0.88 | 0 | 0 | 0.001 |
| Example 12 | 0.99 | 0.87 | 0.88 | 0 | 0 | 0.002 |
| Example 13 | 0.97 | 0.85 | 0.88 | 0 | 0 | 0.005 |
| Example 14 | 0.99 | 0.83 | 0.84 | 0 | 0 | 0.001 |
| Example 15 | 0.99 | 0.89 | 0.90 | 0 | 0 | 0.002 |
| Example 16 | 1.00 | 0.94 | 0.94 | 0 | 0 | 0.005 |
| Example 17 | 0.98 | 0.86 | 0.88 | 0 | 0.001 | 0.001 |
| Comparative Example 1 | 0.97 | 0.85 | 0.88 | 0 | 0 | 0 |
| Comparative Example 2 | 0.97 | 0.85 | 0.88 | 0.06 | 0 | 0 |
| Comparative Example 3 | 1.01 | 0.89 | 0.88 | 0 | 0.05 | 0 |
| Comparative Example 4 | 0.97 | 0.85 | 0.88 | 0 | 0 | 0.01 |

Raw materials were weighed such that x, y, z, v, and w in Formula (2): $(Na_xBa_{1-y})(Nb_yTi_{1-y})O_3$—$(NiO)_z$—$(CuO)_v$—$(MnO_2)_w$ were those shown in Table 1. The raw material powders were mixed with a ball mill for 12 hours.

The raw materials used in Comparative Examples 1 to 4 and Examples 1 to 17 were powders of sodium niobate ($NaNbO_3$) having a purity of 99% or more, barium titanate ($BaTiO_3$) having a purity of 99% or more, nickel(II) oxide (NiO(II)) having a purity of 99.9%, copper(II) oxide (CuO (II)) having a purity of 99.9%, and manganese(IV) oxide ($MnO_2$(IV)) having a purity of 99.9%.

The powder mixture was calcined in the atmosphere at 900° C. to 1100° C. over 2 to 5 hours. The calcined powder was pulverized, and a PVB binder was added thereto in an amount of 3% by weight relative to the weight of the calcined powder, followed by granulation. The granulated powder was placed in a die and was compressed at a pressure of 200 MPa to give a compact having a diameter of 17 mm and a thickness of about 1 mm. The resulting compact was fired in the air at 1150° C. to 1250° C. for 2 to 6 hours to give a sintered compact. The calcination process may be omitted.

The density of each sintered compact was measured by an Archimedes's method, and relative density was calculated. The relative density was 94% or more in all sintered compacts. The density of each sample of the present invention containing at least one element selected from Mn and Ni was higher than that of each sample having the same composition except that the sample did not contain both Mn and Ni. In samples containing Ni, the temperature necessary for calcination and firing could be decreased by 50° C. to 100° C. compared to those of samples not containing Ni.

The sintered compact was ground so as to have a thickness of about 0.5 mm. The ground sintered compact or a powder prepared by pulverizing the ground sintered compact was evaluated for the constituent phase and the lattice constant by X-ray diffraction, which confirmed that each sample was approximately a single phase of a perovskite structure.

The compositions of the sintered compacts were evaluated by inductively coupled plasma atomic emission spectrophotometry (ICP). In all samples excluding Comparative Example 3 and Example 16, the ratio (Na/Nb) of the number of moles of Na to the number of moles of Nb was in a range of 96% to 99%, which means a loss of Na. The grain diameters in the sintered compacts were evaluated by optical microscopic or electron microscopic observation.

The grain diameters of sintered compacts were observed with an electron microscope. The average grain diameters were in a range of 2 to 70 μm.

The distributions of Cu in the sintered compacts were investigated by energy dispersive X-ray spectroscopy. At least in Example 4, Ni was present grain boundaries between grains.

Incidentally, a titanium adhesive layer having a thickness of 30 nm was formed between an electrode and a ceramic. The resulting ceramic layer provided with the electrode was cut into a strip-like piezoelectric element of 10×2.5×0.5 mm.

The resistivity was evaluated with a semiconductor parameter analyzer. A DC voltage of several tens to a hundred volts was applied to each sample, and the resistance at 30 seconds after the start of application of the voltage was measured. The resistivity was calculated from the resulting resistance and the sample size.

The polarization-electric field hysteresis measurement was performed for judging the presence or absence of ferroelectricity in a practical electric field for a target element at room temperature. A material showing ferroelectricity in a certain temperature range is regarded to have piezoelectricity in the same temperature range and can also be used as a memory material. Specifically, the amount of polarization when an AC electric field (triangle waves) was applied to the piezoelectric element of the present invention was measured. The frequency of the AC electric field was 10 to 100 Hz. The magnitude of the electric field was up to about ±50 kV/cm.

Polarization treatment was performed prior to the evaluation of piezoelectric properties. Specifically, a voltage of 1.5 to 5 kV/mm was applied to each sample in an oil bath maintained at 110° C. to 150° C. for 30 minutes, and the temperature was decreased to room temperature while applying the voltage. In Comparative Examples 2 to 4, the insulation resistivity was low such as $10^6$ Ω·cm ($=10^{-3}$ GΩ·cm), and polarization treatment could not be performed.

The Youngs's modulus ($Y_{11}$), electromechanical coupling factor ($k_{31}$), piezoelectric constant ($d_{31}$), and electromechanical quality factor (Qm) of the strip-like piezoelectric element were measured by a resonance-antiresonance method. The piezoelectric constant ($d_{33}$) of the strip-like piezoelectric element was evaluated with a $d_{33}$ meter utilizing the principle of a Berlincourt method. The relative dielectric constant was measured with an impedance analyzer. Throughout the specification, the relative dielectric constant is the value at a measuring frequency of 1 kHz with an application of an AC electric field of 500 mV. The measurement was performed after polarization treatment. The temperature dependability of the relative dielectric constant was evaluated by starting the measurement of the relative dielectric constant at room temperature, cooling the sample from the room temperature to −100° C., and then heating up to 350° C., and the changes in relative dielectric constant were recorded. The Curie temperature and the successive phase transition temperature were calculated from the maximum value of the relative dielectric constant. The typical characteristics of the samples are shown in Tables 2 and 3.

addition, the electromechanical quality factor or the electromechanical coupling factor and the piezoelectric constant $d_{31}$ or $d_{33}$ were improved.

Here, if the addition amount of NiO was larger than 5 mol % as in Comparative Example 2, no perovskite-type metal oxide was formed, and the resistivity was significantly low. Therefore, the piezoelectric properties were not measured.

Figure 15:
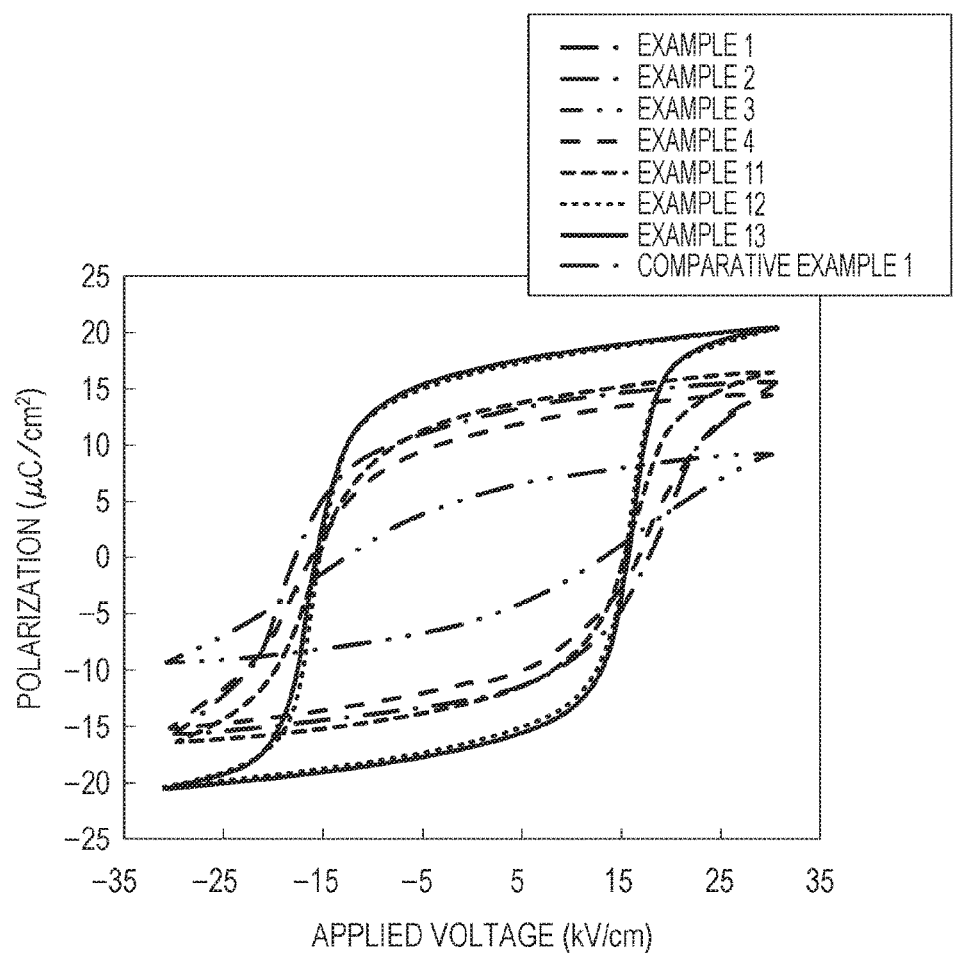
FIG. 15 shows polarization-electric field hysteresis curves of piezoelectric elements of Comparative Example 1 and Examples 1 to 4 and 11 to 13 of the present invention.

It was also confirmed that the addition of Ni increases the amount of polarization determined by polarization-electric field hysteresis measurement. FIG. 15 shows polarization-electric field hysteresis curves in Comparative Example 1 and Examples 1 to 4 and 11 to 13. It was confirmed that the addition of Ni increased the polarization when a certain electric field was applied, compared to Comparative Example.

TABLE 2

| Sample | Curie temperature (° C.) | Relative dielectric constant | Electromechanical coupling factor $k_{31}$ | Piezoelectric constant $|d_{31}|$ (pC/N) | Youngs's modulus $Y_{11}$ (GPa) | Electromechanical quality factor Qm | Piezoelectric constant $|d_{33}|$(pC/N) |
|---|---|---|---|---|---|---|---|
| Example 1 | 195 | 1040 | 0.17 | 47.2 | 126 | 235 | 148 |
| Example 2 | 190 | 1000 | 0.18 | 47.6 | 130 | 224 | 149 |
| Example 3 | 190 | 1000 | 0.19 | 48.0 | 133 | 262 | 150 |
| Example 4 | 190 | 1020 | 0.19 | 48.4 | 134 | 251 | 147 |
| Example 5 | 190 | 1000 | 0.19 | 50.2 | 132 | 308 | 154 |
| Example 6 | 190 | 920 | 0.17 | 43.5 | 129 | 346 | 140 |
| Example 7 | 185 | 1040 | 0.20 | 52.9 | 133 | 243 | 163 |
| Example 8 | 175 | 1010 | 0.19 | 49.3 | 135 | 306 | 151 |
| Example 9 | 230 | 1070 | 0.19 | 52.0 | 130 | 200 | 153 |
| Example 10 | 130 | 1060 | 0.14 | 36.1 | 134 | 305 | 114 |
| Example 11 | 195 | 1090 | 0.22 | 60.1 | 130 | 346 | 172 |
| Example 12 | 190 | 1090 | 0.22 | 60.1 | 130 | 298 | 173 |
| Example 13 | 180 | 950 | 0.19 | 48.3 | 137 | 331 | 151 |
| Example 14 | 115 | 1010 | 0.16 | 41.7 | 132 | 341 | 140 |
| Example 15 | 230 | 1050 | 0.23 | 62.4 | 122 | 310 | 189 |
| Example 16 | 300 | 200 | 0.13 | 15.7 | 116 | 476 | 70 |
| Example 17 | 195 | 1075 | 0.22 | 58.3 | 136 | 440 | 173 |
| Comparative Example 1 | 195 | 1010 | 0.15 | 40.8 | 118 | 327 | 116 |

TABLE 3

| Sample | Resistivity (GΩ · cm) |
|---|---|
| Example 1 | 126 |
| Example 2 | 226 |
| Example 3 | 260 |
| Example 4 | 386 |
| Example 5 | 1630 |
| Example 6 | 97 |
| Example 7 | 2120 |
| Example 8 | 1550 |
| Example 9 | 113 |
| Example 10 | 353 |
| Example 11 | 2240 |
| Example 12 | 3250 |
| Example 13 | 1790 |
| Example 14 | 222 |
| Example 15 | 265 |
| Example 16 | 231 |
| Example 17 | 44 |
| Comparative Example 1 | 16 |

Piezoelectric Material and Piezoelectric Element of Examples 1 to 4, 9, and 10 and Comparative Examples 1 and 2

The samples in Examples 1 to 4 were prepared by adding 0.002 to 0.01 mol of Ni based on 1 mol of the perovskite-type metal oxide represented by Formula (1). The resistivities of the samples in Examples 1 to 4 increased in this order and were higher than that of the sample not containing Ni in Comparative Example 1. The addition of Ni increased the electromechanical coupling factor and the piezoelectric constant $d_{31}$ or $d_{33}$. In addition, the Youngs's modulus was increased, but the electromechanical quality factor was decreased. In Examples 9 and 10, the Curie temperature and the successive phase transition temperature could be controlled by changing the value of y, i.e., the amount of Nb. In Piezoelectric Material and Piezoelectric Element of Examples 11 to 16 and Comparative Example 4

The samples in Examples 11 to 13 were prepared by adding 0.001 to 0.005 mol of Mn based on 1 mol of the perovskite-type metal oxide represented by Formula (1). (Though the calcination was omitted in these Examples, the same results as those when the calcination was performed were obtained.) The resistivities of the samples in Examples 11 to 13 were higher than that in the sample not containing Mn in Comparative Example 1. The addition of Mn increased the electromechanical coupling factor and the piezoelectric constant $d_{31}$ or $d_{33}$. In addition, the Youngs's modulus was increased, but the Curie temperature was decreased with the amount of Mn. This is thought to be caused by solution of at least a part of Mn inside the crystals. Here, since the resistivity of the sample in Example 13 was lower than those of the samples in Examples 11 and 12, the amount of Mn in a sample not containing Ni should be less than 0.005 mol based on 1 mol of the perovskite-type metal oxide represented by Formula (1).

In Examples 14 to 16, the Curie temperature and the successive phase transition temperature could be controlled by changing the value of y, i.e., the amount of Nb. It was also confirmed that the addition of Mn increases the amount of polarization determined by polarization-electric field hysteresis measurement. FIG. 15 also shows polarization-electric field hysteresis curves in Examples 11 to 13. It was confirmed that the addition of Mn increases the polarization under a certain electric field, compared to Comparative Example.

If the addition amount of Mn was larger than 0.005 mol % as in Comparative Example 4, no perovskite-type metal oxide was formed, and the resistivity was significantly low. Therefore, the piezoelectric properties were not measured.

Examples 5 and 6 and Comparative Example 3

The samples in Examples 5 and 6 were prepared by adding 0.005 mol of Ni and also 0.002 mol or 0.005 mol of Cu based on 1 mol of the perovskite-type metal oxide represented by Formula (1). The electromechanical quality factor was improved compared to the sample not containing Cu in Example 2.

Here, if the addition amount of CuO was larger than 1 mol % as in Comparative Example 3, no perovskite-type metal oxide was formed. Therefore, the piezoelectric properties were not measured.

Examples 7 and 8

The samples in Examples 7 and 8 were prepared by adding 0.005 mol of Ni and also 0.002 mol or 0.005 mol of Mn based on 1 mol of the perovskite-type metal oxide represented by Formula (1). The electromechanical quality factor was improved compared to the sample not containing Mn in Example 2.

Example 17

The sample in Example 17 was prepared by adding 0.0005 mol of Mn and also 0.0005 mol of Cu based on 1 mol of the perovskite-type metal oxide represented by Formula (1). The resistivity and the electromechanical quality factor were improved compared to the sample not containing Mn and Cu in Example 1.

Example 90

Raw materials corresponding to those in Example 2 were weighed as follows.

Sodium niobate, barium titanate, nickel(II) oxide powders were weighed such that the composition of Na, Nb, Ti, Ba, and Ni was as shown in Example 2 of Table 1. The weighed raw material powders were mixed with a ball mill overnight.

The resulting mixed powder was mixed with PVB, followed by formation into a green sheet having a thickness of 50 μm by a doctor blade method.

A conductive paste for an internal electrode was printed onto the green sheet. The conductive paste used was an Ag 70%-Pd 30% alloy (Ag/Pd=2.33) paste. Nine green sheets each provided with the conductive paste were stacked, and the resulting layered product was fired at 1200° C. for 5 hours to obtain a sintered compact. The sintered compact was cut into a size of 10×2.5 mm. The side faces were ground, and a pair of external electrodes (a first electrode and a second electrode) for alternately short-circuiting the internal electrodes was formed by sputtering Au to produce a multilayered piezoelectric element as shown in FIG. 2B.

The internal electrodes of the resulting multilayered piezoelectric element were observed, and it was confirmed that Ag—Pd as the electrode material and the piezoelectric material were alternately formed.

The sample was subjected to polarization treatment prior to evaluation of piezoelectric properties. Specifically, the sample was heated to 130° C. to 150° C. in an oil bath, a voltage of 1.5 kV/cm was applied between the first and the second electrodes for 30 minutes, and the temperature was decreased to room temperature while applying the voltage.

The piezoelectricity of the resulting multilayered piezoelectric element was evaluated, and it was confirmed that sufficient insulation was obtained and that satisfactory piezoelectric properties equivalent to those of the sample in Example 2 were obtained.

Example 91

Sodium niobate, barium titanate, and nickel oxide powders were weighed such that the composition of Na, Nb, Ti, Ba, and Ni was as shown in Example 3 of Table 1. The weighed raw material powders were mixed with a ball mill overnight. The resulting mixed powder was mixed with 3 parts by weight of a PVB binder, followed by formation into a green sheet having a thickness of 50 μm by a doctor blade method.

A conductive paste for an internal electrode was printed onto the green sheet. The conductive paste used was a Ni paste. Nine green sheets each provided with the conductive paste were stacked, and the resulting layered product was bonded by thermocompression.

The thermocompressed layered product was fired in a tube furnace. The firing was performed in the air up to 300° C., the binder was then removed, and the firing was further continued in a reducing atmosphere ($H_2:N_2=2:98$, oxygen concentration: $2\times10^{-6}$ Pa) at 1200° C. for 5 hours. In the temperature lowering process, the oxygen concentration was changed to 30 Pa when the temperature was decreased to 1000° C., followed by cooling down to room temperature.

The thus-prepared sintered compact was cut into a size of 10×2.5 mm. The side faces were ground, and a pair of external electrodes (a first electrode and a second electrode) for alternately short-circuiting the internal electrodes was formed by sputtering Au to produce a multilayered piezoelectric element as shown in FIG. 3B.

The internal electrodes of the resulting multilayered piezoelectric element were observed, and it was confirmed that that Ni as the electrode material and the piezoelectric material layers were alternately formed. The resulting multilayered piezoelectric element was applied with an electric field of 2 kV/mm for 30 minutes in an oil bath maintained at 110° C. to 150° C. for polarization treatment. The piezoelectric properties of the resulting multilayered piezoelectric element were evaluated, and it was confirmed that sufficient insulation was obtained and that satisfactory piezoelectric properties equivalent to those of the sample in Example 3 were obtained.

Example 100

A liquid discharge head shown in FIGS. 3A and 3B was produced using the piezoelectric element of Example 5. Discharge of an ink according to input electric signals was confirmed.

Example 101

A liquid discharge device shown in FIG. 4 was produced using the liquid discharge head of Example 100. Discharge of an ink onto a recoding medium according to input electric signals was confirmed.

Example 102

An ultrasonic motor shown in FIG. 6A was produced using the piezoelectric element in Example 5. Rotation behavior of the motor according to application of an alternating voltage was confirmed.

Example 103

An optical apparatus shown in FIGS. 7A and 7B was produced using the ultrasonic motor in Example 102. Autofocus operation according to application of an alternating voltage was confirmed.

Example 104

A dust removing device shown in FIGS. 9A and 9B was produced using the piezoelectric element in Example 5. A satisfactory dust removing efficiency was confirmed when plastic beads were dispersed and an alternating voltage was applied thereto.

Example 105

An image pickup device shown in FIG. 12 was produced using the dust removing device in Example 104. In the operation of the device, dust on the surface of the image pickup unit was satisfactorily removed to provide a dust defect-free image.

Example 106

A liquid discharge head shown in FIGS. 3A and 3B was produced using the multilayered piezoelectric element in Example 90. Discharge of an ink according to input electric signals was confirmed.

Example 107

A liquid discharge device shown in FIG. 4 was produced using the liquid discharge head in Example 106. Discharge of an ink onto a recoding medium according to input electric signals was confirmed.

Example 108

An ultrasonic motor shown in FIG. 6B was produced using the multilayered piezoelectric element in Example 90. Rotation behavior of the motor according to application of an alternating voltage was confirmed.

Example 109

An optical apparatus shown in FIGS. 7A and 7B was produced using the ultrasonic motor in Example 108. Autofocus operation according to application of an alternating voltage was confirmed.

Example 110

A dust removing device shown in FIGS. 9A and 9B was produced using the multilayered piezoelectric elements in Examples 90 and 91. A satisfactory dust removing efficiency was confirmed when plastic beads were dispersed and an alternating voltage was applied thereto.

Example 111

An image pickup device shown in FIG. 12 was produced using the dust removing device in Example 110. In the operation of the device, dust on the surface of the image pickup unit was satisfactorily removed to provide a dust defect-free image.

Example 112

An electronic apparatus shown in FIG. 14 was produced using the multilayered piezoelectric elements in Examples 90 and 91. Loudspeaker operation according to application of an alternating voltage was confirmed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-186594, filed Aug. 27, 2012, which is hereby incorporated by reference herein in its entirety.

INDUSTRIAL APPLICABILITY

The piezoelectric material of the present invention exhibits satisfactory piezoelectricity even under a high temperature atmosphere. Since the piezoelectric material of the present invention does not contain lead, its load on the environment is low. Accordingly, the piezoelectric material of the present invention can be used in various apparatuses including a large amount of the piezoelectric material, such as a liquid discharge head, an ultrasonic motor, and a dust removing device, without any problem.

REFERENCE SIGNS LIST 1 first electrode
2 piezoelectric material portion
3 second electrode
101 piezoelectric element
102 individual liquid chamber
103 diaphragm
104 liquid chamber partition
105 discharge port
106 communication hole
107 common liquid chamber
108 buffer layer
1011 first electrode
1012 piezoelectric material
1013 second electrode
201 oscillator
202 rotor
203 output shaft
204 oscillator
205 rotor
206 spring
2011 elastic ring
2012 piezoelectric element
2013 organic adhesive
2041 metal elastic body
2042 multilayered piezoelectric element
310 dust removing device
330 piezoelectric element
320 diaphragm
330 piezoelectric element
331 piezoelectric material
332 first electrode
333 second electrode
336 first electrode face 337 second electrode face
310 dust removing device
320 diaphragm
330 piezoelectric element
51 first electrode
53 second electrode
54 piezoelectric material layer
55 internal electrode
56 multilayered piezoelectric element
501 first electrode
503 second electrode
504 piezoelectric material layer
505a internal electrode
506a external electrode
506b external electrode
601 camera body
602 mount portion
605 mirror box
606 main mirror
200 shutter unit
300 body chassis
400 image pickup unit
701 front lens group
702 rear lens group (focus lens)
711 quick-detaching mount
712 fixing barrel
713 linear guide barrel
714 front lens group barrel
715 cam ring
716 rear lens group barrel
717 cam roller
718 axial screw
719 roller
720 rotation transmitting ring
722 driven roller
724 manual focus ring
725 ultrasonic motor
726 wave washer
727 ball race
728 focus key
729 connecting member
732 washer
733 low friction sheet
881 liquid discharge device
882 exterior
883 exterior
884 exterior
885 exterior
887 exterior
890 recovering portion
891 recording portion
892 carriage
896 device main body
897 automatic feeder
898 ejection port
899 conveying unit
901 optical device
908 release button
909 stroboscope light emitting unit
912 loudspeaker
914 microphone
916 assist light unit
931 body
932 zoom lever
933 power button

The invention claimed is:

1. A piezoelectric material comprising:
an oxide containing Na, Ba, Nb, and Ti; and
at least one element selected from Mn and Ni,
wherein x, which is a molar ratio of Na based on a sum of numbers of moles of Nb and Ti, is in a range of $0.80 \leq x \leq 0.94$,
y, which is a molar ratio of Nb based on the sum, is in a range of $0.83 \leq y \leq 0.94$, and
a molar ratio of Ba based on the sum is 0.06 or more and 0.17 or less, and
wherein a requirement of $x<y$ is satisfied.

2. The piezoelectric material according to claim 1, wherein
the oxide is represented by Formula (1): $(Na_xBa_{1-y})(Nb_yTi_{1-y})O_3$, and
wherein $0.80 \leq x \leq 0.94$ and $0.83 \leq y \leq 0.94$.

3. The piezoelectric material according to claim 1, further comprising 0.01 mol or less of Cu based on the sum.

4. The piezoelectric material according to claim 1,
wherein the content of the Ni is 0.05 mol or less based on the sum, and
the content of the Mn is 0.005 mol or less based on the sum.

5. A piezoelectric ceramic comprising a piezoelectric material, wherein
the piezoelectric material comprises the piezoelectric material according to claim 1; and
Mn is present inside crystal grains constituting the piezoelectric ceramic.

6. A piezoelectric ceramic comprising a piezoelectric material, wherein
the piezoelectric material comprises the piezoelectric material according to claim 1; and
Ni is present at grain boundaries of crystal grains constituting the piezoelectric ceramic.

7. A piezoelectric element comprising:
an electrode; and
the piezoelectric material according to claim 1.

8. The piezoelectric element according to claim 7,
wherein the piezoelectric material and the electrode are alternately stacked.

9. The piezoelectric element according to claim 8, wherein
the electrode comprises Ag and Pd, and
the weight ratio M1/M2 of the weight content M1 of the Ag to the weight content M2 of the Pd satisfies $1.5 \leq M1/M2 \leq 9.0$.

10. The piezoelectric element according to claim 8, wherein the electrode comprises at least one of Ni and Cu.

11. A method of producing the piezoelectric element according to claim 8, comprising:
(A) preparing a slurry by dispersing a metal compound powder containing Na, Nb, Ba, Ti, and at least one element selected from Ni and Mn;
(B) preparing a green compact from the slurry;
(C) forming a layered product by forming an electrode on the green compact and alternately stacking the green compacts containing the metal compound and the electrodes; and
(D) preparing a multilayered piezoelectric element by sintering the layered product, wherein
the sintering in the step (D) is performed at a sintering temperature of 1200° C. or less.

12. A liquid discharge head comprising a liquid chamber provided with a vibratory unit comprising the piezoelectric element according to claim 7 and a discharge port communicating with the liquid chamber.

13. A liquid discharge device comprising a conveying unit for conveying a recording medium and the liquid discharge head according to claim 12.

14. An ultrasonic motor comprising:
a first component comprising the piezoelectric element according to claim 7, and a second component being in contact with the first component.

15. An optical apparatus comprising a driving unit provided with the ultrasonic motor according to claim 14.

16. A vibratory device comprising a first component provided with the piezoelectric element according to claim 7.

17. A dust removing device comprising a vibratory unit provided with the vibratory device according to claim 16.

18. An image pickup device comprising:
the dust removing device according to claim 17, and
an image pickup element unit,
wherein the dust removing device has a diaphragm disposed on the light-receiving surface side of the image pickup element unit.

19. A piezoelectric acoustic component comprising the piezoelectric element according to claim 7.

20. An electronic apparatus comprising the piezoelectric element according to claim 7.

21. A piezoelectric material comprising:
an oxide containing Na, Ba, Nb, and Ti; and
at least one element selected from Mn and Ni,
wherein x, which is a molar ratio of Na based on a sum of numbers of moles of Nb and Ti, is in a range of $0.80 \leq x < 0.92$,
y, which is a molar ratio of Nb based on the sum, is in a range of $0.80 \leq y < 0.92$, and
a molar ratio of Ba based on the sum is more than 0.08 and 0.20 or less, and wherein the content of the Ni is 0.05 mol or less based on the sum, and the content of the Mn is 0.005 mol or less based on the sum.

22. The piezoelectric material according to claim 21, wherein the oxide is represented by Formula (1): $(Na_xBa_{1-y})(Nb_yTi_{1-y})O_3$, and wherein $0.80 \leq x < 0.92$ and $0.83 \leq y < 0.92$.

23. The piezoelectric material according to claim 21, further comprising 0.01 mol or less of Cu based on the sum.

24. The piezoelectric material according to claim 21, wherein a requirement of $x < y$ is satisfied.

25. A piezoelectric ceramic comprising a piezoelectric material,
wherein the piezoelectric material comprises the piezoelectric material according to claim 21; and
Mn is present inside crystal grains constituting the piezoelectric ceramic.

26. A piezoelectric ceramic comprising a piezoelectric material, wherein
the piezoelectric material comprises the piezoelectric material according to claim 21; and
Ni is present at grain boundaries of crystal grains constituting the piezoelectric ceramic.

27. A piezoelectric element comprising:
an electrode; and
the piezoelectric material according to claim 21.

28. The piezoelectric element according to claim 27, wherein the piezoelectric material and the electrode are alternately stacked.

29. The piezoelectric element according to claim 28, wherein
the electrode comprises Ag and Pd, and
the weight ratio M1/M2 of the weight content M1 of the Ag to the weight content M2 of the Pd satisfies $1.5 \leq M1/M2 \leq 9.0$.

30. The piezoelectric element according to claim 28, wherein the electrode comprises at least one of Ni and Cu.

31. A method of producing the piezoelectric element according to claim 28, comprising:
(A) preparing a slurry by dispersing a metal compound powder containing Na, Nb, Ba, Ti, and at least one element selected from Ni and Mn;
(B) preparing a green compact from the slurry;
(C) forming a layered product by forming an electrode on the green compact and alternately stacking the green compacts containing the metal compound and the electrodes; and
(D) preparing a multilayered piezoelectric element by sintering the layered product, wherein
the sintering in the step (D) is performed at a sintering temperature of 1200° C. or less.

32. A liquid discharge head comprising a liquid chamber provided with a vibratory unit comprising the piezoelectric element according to claim 27 and a discharge port communicating with the liquid chamber.

33. A liquid discharge device comprising a conveying unit for conveying a recording medium and the liquid discharge head according to claim 32.

34. An ultrasonic motor comprising:
a first component comprising the piezoelectric element according to claim 27, and a second component being in contact with the first component.

35. An optical apparatus comprising a driving unit provided with the ultrasonic motor according to claim 34.

36. A vibratory device comprising a first component provided with the piezoelectric element according to claim 27.

37. A dust removing device comprising a vibratory unit provided with the vibratory device according to claim 36.

38. An image pickup device comprising:
the dust removing device according to claim 37, and
an image pickup element unit,
wherein the dust removing device has a diaphragm disposed on the light-receiving surface side of the image pickup element unit.

39. A piezoelectric acoustic component comprising the piezoelectric element according to claim 27.

40. An electronic apparatus comprising the piezoelectric element according to claim 27.

* * * * *